(12) United States Patent
Vak et al.

(10) Patent No.: US 12,745,506 B2
(45) Date of Patent: Sep. 22, 2026

(54) INTERCONNECTION IN AN INTEGRATED MULTILAYER THIN-FILM ELECTRONIC DEVICE

(71) Applicant: Commonwealth Scientific and Industrial Research Organisation, Australian Capital Territory (AU)

(72) Inventors: Doojin Vak, Victoria (AU); Regine Chantler, Victoria (AU); Hasitha Weerasinghe, Victoria (AU)

(73) Assignee: COMMONWEALTH SCIENTIFIC AND INDUSTRIAL RESEARCH IRGABUSATION, Acton (AU)

( * ) Notice: Subject to any disclaimer, the term of this patent is extended or adjusted under 35 U.S.C. 154(b) by 448 days.

(21) Appl. No.: 18/548,047

(22) PCT Filed: Mar. 1, 2022

(86) PCT No.: PCT/AU2022/050162
§ 371 (c)(1),
(2) Date: Aug. 25, 2023

(87) PCT Pub. No.: WO2022/183239
PCT Pub. Date: Sep. 9, 2022

(65) Prior Publication Data

US 2024/0138248 A1 Apr. 25, 2024
US 2024/0237504 A9 Jul. 11, 2024

(30) Foreign Application Priority Data

Mar. 4, 2021 (AU) ................................ 2021900606

(51) Int. Cl.
*H10K 30/81* (2023.01)
*H10K 39/00* (2023.01)
(Continued)

(52) U.S. Cl.
CPC ............ *H10K 30/81* (2023.02); *H10K 39/12* (2023.02); *H10K 39/18* (2023.02); *H10K 39/621* (2023.02);
(Continued)

(58) Field of Classification Search
CPC ........ H10K 30/81; H10K 71/60; H10K 71/40; H10K 39/12; H10K 39/621; H10K 39/18; H10K 85/50
(Continued)

(56) References Cited

U.S. PATENT DOCUMENTS 10,593,735 B2 * 3/2020 Chang .................... H05B 45/10
2010/0029466 A1 2/2010 Woodhouse
(Continued)

FOREIGN PATENT DOCUMENTS

JP 2011-124582 A 6/2011
WO 2008/051275 A2 5/2008
(Continued)

OTHER PUBLICATIONS

Extended European Search Report from Application No. 23758215.0 dated Sep. 4, 2025.
(Continued)

*Primary Examiner* — Tu-Tu V Ho
(74) *Attorney, Agent, or Firm* — Merchant & Gould P.C.

(57) ABSTRACT

A process of forming an electrode interconnection between at least two adjacent unit devices in an integrated multilayer thin-film electronic device comprising: providing an intermediary device that comprises: a first electrode layer on a thin film substrate comprising a first patterned coating that includes at least two spaced apart first electrode sections of adjacent unit devices; a first functional layer comprising a substantially continuous coating over the first electrode
(Continued)

layer; and a second functional layer comprising a second patterned coating on the first functional layer comprising at least two spaced apart functional sections, each functional section positioned on the first functional layer to overlay a portion of one of the first electrode sections so to define a gap portion between adjacent functional sections that includes a portion of that first electrode section and the first functional layer; and applying a second electrode layer over the second functional layer as a third patterned coating that includes at least two spaced apart second electrode sections of adjacent unit devices, each second electrode section being positioned to overlay at least one functional section of the second functional layer and a portion of an adjoining gap portion that includes at least one portion of the first electrode section of an adjacent unit device, the third patterned coating being formed using a solution including a conductive species and at least a first solvent, wherein the first functional layer is soluble in the first solvent and the second functional layer has a low to zero solubility in the first solvent, such that application of the second electrode layer to the gap portion forms at least one electrically conductive path through the first functional layer between the first electrode and the second electrode of adjacent unit devices.

20 Claims, 8 Drawing Sheets

(51) Int. Cl.
*H10K 39/12* (2023.01)
*H10K 39/18* (2023.01)
*H10K 71/60* (2023.01)
*H10K 71/40* (2023.01)
*H10K 85/50* (2023.01)

(52) U.S. Cl.
CPC ............. *H10K 71/60* (2023.02); *H10K 71/40* (2023.02); *H10K 85/50* (2023.02)

(58) Field of Classification Search
USPC ............................................................ 257/49
See application file for complete search history.

(56) References Cited

U.S. PATENT DOCUMENTS

2013/0177481 A1 7/2013 Hokari et al.
2015/0233577 A1 8/2015 Iijima
2016/0001223 A1 1/2016 Okuno et al.
2017/0084399 A1 3/2017 Vak
2018/0005764 A1 1/2018 Jones et al.
2019/0393423 A1 12/2019 Yan et al.
2020/0381568 A1 12/2020 Lifka et al.
2021/0220771 A1 7/2021 Lefebvre et al.

FOREIGN PATENT DOCUMENTS

WO 2013104514 A1 7/2013
WO 2016/115602 A1 7/2016
WO 2019070977 A1 4/2019
WO 2020/084285 A1 4/2020

OTHER PUBLICATIONS

Sun, Yan "Controlled morphology in bulk heterojunction polymer and perovskite solar cells," A dissertation presented to The Graduate Faculty of The University of Akron (2016).
Angmo, Dechan et al., "A Lab-to-Fab Study toward Roll-to-Roll Fabrication of Reproducible Perovskite Solar Cells under Ambient Room Conditions," Cell Reports Physical Science, vol. 2, Issue 1: 100293 (2021).
Chen, Li-Min et al., "Recent Progress in Polymer Solar Cells: Manipulation of Polymer: Fullerene Morphology and the Formation of Efficient Inverted Polymer Solar Cells," Advanced Materials, vol. 21, Issue 14-15: 1434-1449 (2009).
Vak, Doojin et al., "3D Printer Based Slot-Die Coater as a Lab-to-Fab Translation Tool for Solution-Processed Solar Cells," Advanced Energy Materials, vol. 5, Issue 4: 1401539 (2015).
Lee, Tack Ho, et al., "Efficient Exciton Diffusion in Organic Bilayer Heterojunctions with Nonfullerene Small Molecular Acceptors", ACS Energy Letters, vol. 5: 1628-1635, p. 1360 (2020).
Zhang, Jiangbin et al., "Efficient Non-fullerene Organic Solar Cells Employing Sequentially Deposited Donor-Acceptor Layers", Journal of Materials Chemistry A, vol. 6: 18225-18233, p. 18228 (2018).
International Search Report and Written Opinion for PCT/AU2022/050162 (Mar. 9, 2022).
Japanese Office Action received for JP Application No. 2023-553344 on Jan. 13, 2026, 18 pgs.

* cited by examiner (a) (b) (c)

INTERCONNECTION IN AN INTEGRATED MULTILAYER THIN-FILM ELECTRONIC DEVICE

PRIORITY CROSS-REFERENCE

The present application is a National Stage Application of PCT/AU2022/050162, filed on 1 Mar. 2022, which claims benefit of priority to Australian provisional patent application No. 2021900606, filed on 4 Mar. 2021, and which applications are incorporated herein by reference. To the extent appropriate, a claim of priority is made to each of the above disclosed applications.

TECHNICAL FIELD

The present invention generally relates to a process of forming an interconnection between electrodes of at least two adjacent unit devices in an integrated multilayer thin-film electronic device. The invention is particularly applicable for solution-processed thin film photovoltaics (PV) devices, and it will be convenient to hereinafter disclose the invention in relation to that exemplary application. However, it should be appreciated that the invention is applicable to forming electrical interconnections in a number of different types of thin-film electronic devices, particularly solution-processed electronic devices such as organic transistors, OLEDs, organic memories and printed sensors.

BACKGROUND TO THE INVENTION

The following discussion of the background to the invention is intended to facilitate an understanding of the invention. However, it should be appreciated that the discussion is not an acknowledgement or admission that any of the material referred to was published, known or part of the common general knowledge as at the priority date of the application.

Solution-processed thin-film electronic devices, including photovoltaics (PV), are promising next-generation electronics. Multiple thin-film electronic are required to be interconnected to scale up single devices for real-world applications. For example, PV cells are typically used in the form of a module, comprising a group of PV cells connected in series, for the required output for particular applications.

Conventionally the interconnections of unit devices are made through placing physical gaps between the functional layers of the unit devices which allow the spaced apart electrodes to overlap and physically connect. For the fabrication of modules, such gaps are formed by patterning the module to create the gaps. The patterning can be done by one of the three approaches illustrated in FIG. 1.

Firstly, 2D printing methods (shown in FIG. 1(*a*)) including inkjet printing, screen printing, gravure printing and etc: The printing methods provide freedom in 2D pattern. Any pattern and gaps can be set for modules. However, such processes produce a layer by a group of dots and result in non-uniformity of the final film at micrometer scale. Moreover, the method lacks thickness control. Therefore, such methods have not been the preferred method for the fabrication of thickness-sensitive layers, such as the photo-active layer of PV devices.

Secondly, stripe pattern coating by slot die or reverse gravure methods is shown in FIG. 1(*b*). The approach has been most commonly used for the fabrication of printed PVs due to practicality of the process. Although such coating methods produce much better uniform film over 2D printing methods, the thickness of the edge of each stripe is different from the middle due to the Marangoni flow during the drying process (commonly known as coffee-ring effect). Moreover, narrow gaps of 0.5 mm or less cannot be produced reliably in the manufacturing process, and it means loss of device area.

Thirdly, unpatterned coating and scribing approach is illustrated in FIG. 1(*c*): This approach is the most ideal for achieving uniformity and high cell-area over the total substrate (so-called geometry fill factor, GFF). The uniformity provides high cell-area efficiency and the high GFF provides higher output power compared to the conventional approach. However, this approach has not been widely used large-area modules due to the substantial cost for in-line scribers for manufacturing.

It is therefore desirable to provide a new and/or improved process of forming an electrode interconnection in an integrated multilayer thin-film electronic device, and more particularly a solution-processed thin-film electronic device.

SUMMARY OF THE INVENTION

The present invention relates to a method to of forming an electrode interconnection in an integrated multilayer thin-film electronic device.

The present invention provides in a first aspect a process of forming an electrode interconnection between at least two adjacent unit devices in an integrated multilayer thin-film electronic device comprising:

- providing an intermediary device that comprises:
  - a first electrode layer on a thin film substrate comprising a first patterned coating that includes at least two spaced apart first electrode sections of adjacent unit devices;
  - a first functional layer comprising a substantially continuous coating over the first electrode layer; and
  - a second functional layer comprising a second patterned coating on the first functional layer comprising at least two spaced apart functional sections, each functional section positioned on the first functional layer to overlay a portion of one of the first electrode sections so to define a gap portion between adjacent functional sections that includes a portion of that first electrode section and the first functional layer; and
- applying a second electrode layer over the second functional layer as a third patterned coating that includes at least two spaced apart second electrode sections of adjacent unit devices, each second electrode section being positioned to overlay at least one functional section of the second functional layer and a portion of an adjoining gap portion that includes at least one portion of the first electrode section of an adjacent unit device, the third patterned coating being formed using a solution including a conductive species and at least a first solvent,
- wherein the first functional layer is soluble in the first solvent and the second functional layer has a low to zero solubility in the first solvent, such that application of the second electrode layer to the gap portion forms at least one electrically conductive path through the first functional layer between the first electrode and the second electrode of adjacent unit devices.

The present invention therefore provides an alternative process for forming an electrical connection between spaced apart electrodes through the functional layers of an integrated multilayer thin-film electronic device by utilising the selective solubility of components of the multilayer film with the solvent used to form the second electrode layer.

Whilst not wishing to be limited to any one theory, the Inventors consider that the differential orthogonal solubility of alternating material layers is the key to forming the electrical interconnection between the electrode layers. Here the multiple layers are formed with alternating polarities to allow the subsequent layer to be applied/deposited without redissolving the underlying layer. The first solvent dissolves at least part of the first functional layer in the gap portion, to form an electrical interconnect between the first electrode layer and second electrode layer through the first functional layer. In contrast, the second functional layer is not affected by the first solvent and does not dissolve on application of the second electrode layer.

The second functional layer preferably has a substantially low to zero solubility in the first solvent. This low solubility ensures that the second functional layer remains substantially intact (defect free) when the second electrode layer is applied.

The differential orthogonal solubility of alternating material layers can be achieved by applying the layers with alternating polarities. In preferred embodiments, the first functional layer and the second functional layers have different polarities. In some embodiments, the first functional layer comprises a polar layer and the second functional layer comprise a non-polar layer. In other embodiments, the first functional layer comprises a non-polar layer and the second functional layer comprises a polar layer. In this alternating polarity layup, the first solvent preferably has the same polarity as the first functional layer.

Thus, where the first functional layer is a polar layer, the first solvent is a polar solvent. Where the first functional layer is a non-polar layer, the first solvent is a non-polar solvent. The second functional layer is a different polarity to the first functional layer (in terms of being polar or non-polar), and thus has a low to zero solubility with the first solvent. The process can repeat and form a multilayer with alternating polarity. i.e. polar/non-polar/polar/non-polar materials.

The first solvent can comprise any suitable solvent for application of the second electrode layer, and also to dissolve part of the first functional layer to form at least one electrically conductive path through the first functional layer between the first electrode and the second electrode of adjacent unit devices. In embodiments, the first solvent comprises one or more of:

DMF, DMSO, Y-butyrolactone, acetone, acetyl acetone, ethyl acetoacetate, NMP, DMAC, THF or combinations thereof;

isopropanol, n-butanol, isobutanol, ethanol, methanol, acetic acid, ethylene glycol, propylene glycol, glycerol, allyl alcohol, propargyl alcohol, inositol or combinations thereof; or benzene, toluene, xylene, trimethylbenzenes (for example mesitylene), chlorobenzene, dichlorobenzene, chloroform, dichloromethane, anisole, propylene glycol methyl ether acetate, diethylene glycol mono butyl ether, di(propylene glycol) dimethyl ether or combinations thereof.

It should be appreciated that selection of the first solvent depends on the required polarity and the composition of the various layers. Where the integrated multi-layer thin film electronic device comprises an optoelectronic device, and in particular a photovoltaic device, selection of the first solvent depends on the composition of the photovoltaic layer. For example, for perovskite devices, the first solvent is preferably selected from: DMF, DMSO, Y-butyrolactone, acetone, acetyl acetone, ethyl acetoacetate, NMP, DMAC, THF or combinations thereof; or isopropanol, n-butanol, iso-butanol, ethanol, methanol, acetic acid, ethylene glycol, propylene glycol, glycerol, allyl alcohol, propargyl alcohol, inositol or combinations thereof. For organic PV devices, the first solvent is preferably selected from benzene, toluene, xylene, trimethylbenzenes (for example mesitylene), chlorobenzene, dichlorobenzene, chloroform, dichloromethane, anisole, propylene glycol methyl ether acetate, diethylene glycol mono butyl ether, di(propylene glycol) dimethyl ether or combinations thereof.

It should be understood that the thin-film electronic device comprises at least two adjacent unit devices, and more preferably a series of adjacent unit devices on the thin film substrate. Each adjacent unit device can include an interconnect formed according to the first aspect of the present invention. In some embodiments, a plurality of unit devices can be arranged in a module, each adjacent unit device of that module interconnected according to the first aspect of the present invention. The integrated multilayer thin-film electronic device may include a number of unit devices, and/or a number of modules arranged on the thin film substrate in a design configuration. Adjacent modules can likewise be connected/interconnected using the process according to the first aspect of the present invention.

It should also be understood that the unit device comprises an individual device or unit in the thin-film electronic device that requires to be interconnected in series or parallel to form a larger integrated electronic device. An example exemplified in detail in this specification is individual cells (unit device) in an optoelectrical devices, and in particular photovoltaic devices. However, it should be appreciated that the present invention can be applied to connect unit devices making up the integrated structure of many other solution-processed integrated multilayer thin-film electronic devices such as organic transistors, OLEDs, organic memories and printed sensors.

The first solvent typically dissolves a portion of the first functional layer to form an electrically conductive path between the first electrode and the second electrode of adjacent unit devices through the first functional layer. In embodiments, the portion dissolved forms one or more channels through the first functional layer. The electrical interconnect is therefore typically one or more channels through the first functional layer. The amount of the first functional layer that is dissolved is typically small, forming nano- to micro-sized channels in first functional layer. In embodiments, the at least one electrically conductive path between the first electrode and the second electrode of adjacent unit devices comprises one or more micro- or nano-sized paths, preferably one or more micro- or nano-sized channels through the first functional layer. In some embodiments, the at least one electrically conductive path between the first electrode and the second electrode of adjacent unit devices comprises one or more micro- to nano-sized paths or channels through the first functional layer. In embodiments, the at least one electrically conductive path comprises a multitude of micro- to nano-sized paths or channels, in some cases millions of micro- to nano-sized paths or channels. More particularly, the at least one electrically conductive path between the first electrode layer and second electrode layer preferably comprises more or more defects in the first functional layer, preferably one or more pinhole defects through the thickness of the first functional layer.

It should be appreciated that the at least one conductive path can comprise any number of paths or channels between the first electrode and the second electrode of adjacent unit devices through the first functional layer. Typically, the process forms a large number of nano- to micro-paths or channels. In most cases, the at least one conductive path comprises millions of nano- to micro-channels through the first functional layer. For example, a whole area of a 2 mm×100 mm line comprising the multilayer thin-film electronic device can be a conductive path, depending on the layer configuration. In some cases, the whole layer (the first functional layer uncovered by the second functional layer under the second electrode) can be uniformly conductive. In these embodiments, substantially all or all of the gap portion (that portion of the first functional layer uncovered by the second functional layer under the second electrode) provides the conductive path between the first electrode and the second electrode. Each of the nano- to micro-paths or channels are distributed through, along and about the first functional layer to form the conductive path between the first electrode and the second electrode.

Whilst not wishing to be limited by any one theory, in these embodiments the inventors have utilised a well-known failure mechanism in integrated multilayer thin-film electronic device where solvents from one or more subsequently applied layers can damage the structure of a layer that that layer is applied over. For example, when an organic-solvent-based conducting paste is deposited on top of the organic thin-film layer, the thin film will be damaged, lose the function and form a conducting channel through the layer. The solvent can create physical defects in that layer, for example short-circuit formation through pinholes of that organic thin-film layer.

Whilst the conductive path typically comprises nano- to micro-channels through the first functional layer, it should be appreciated that the present invention can create other morphologies. For example, in some embodiments, the conductive path may be formed at a larger scale, for example micro- to mm-sized channels or paths. Moreover, other configurations other than paths or channels could be used, for example apertures or openings through the first functional layer.

The gap portion between adjacent functional sections is preferably configured to locate the at least one electrically conductive path through the first functional layer between the first electrode and the second electrode of adjacent unit devices. Accordingly, the gap portions between adjacent functional sections preferably comprises the first electrode layer and first functional layer only.

The integrated multilayer thin-film electronic device can have any number of functional layers. The nature and number of the functional layers depends on the function and required configuration of the integrated multilayer thin-film electronic device. In some embodiments, the intermediary device includes at least one further functional layer between the first electrode layer and the second electrode layer, preferably between the first electrode layer and the second functional layer. In some embodiments, the intermediary device includes at least one of: at least one further functional layer between the first function layer and second functional layer; or at least one further functional layer between the first electrode layer and the first functional layer.

The at least one further functional layer could be two or more layers. It should be appreciated that in some embodiments, it is also possible for further coatings/layers between first electrode layer and substrate. In these embodiments, each further functional layer preferably comprises a patterned coating that includes at least two spaced apart second sections having a complementary configuration to the functional sections of the second functional layer. It should be appreciated that the "complementary configuration" relates to a complementary pattern and/or shape to the functional sections of the functional sections of the second function layer. In this sense, the at least one further functional layer the second functional layer is applied with a complementary and/or corresponding pattern to the second functional layers so to also define a similar and substantially corresponding gap portion to the gap portion of the second functional layer between adjacent functional sections within that further functional layer. This ensures that there is also a suitable gap in the further functional layers or layers for forming an electrical connection between spaced apart electrodes that can be utilised as previously discussed.

In embodiments, the further functional layer comprises a further charge selective layer. The further charge selective layer can comprise at least one of: at least one electrode screening layer; at least one hole blocking layer; at least one electron blocking layer; at least one hole transporting layer; or at least one electron transporting layer. In embodiments, the further functional layer comprises a complementary charge selective layer to the second functional layer which is preferably located between the first electrode layer and the first functional layer.

In some embodiments, the intermediary device includes at least one further functional layer between the substrate and the first functional layer. For example, the substrate may include a further coating layer thereon.

The intermediary device can also be formed through sequential application of the various layers. In embodiments, the process can further comprise forming an intermediary device by:

- applying a first electrode layer on a thin film substrate comprising a first patterned coating that includes at least two spaced apart first electrode sections of adjacent unit devices;
- applying a first functional layer comprising a substantially continuous coating over the first electrode layer; and
- applying a second functional layer comprising a second patterned coating on the first functional layer comprising at least two spaced apart functional sections, each functional section positioned on the first functional layer to overlay a portion of one of the first electrode sections so to define a gap portion between adjacent functional sections that includes a portion of that first electrode section and the first functional layer.

The various layers can be applied to form the integrated multilayer thin-film electronic device and/or the intermediary device using a variety of application techniques. In some embodiments, at least one of the first electrode layer, first functional layer, second functional layer or second electrode layer is applied to the substrate using at least one of: casting, doctor blading, printing, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, or dip coating.

In some embodiments, the process of the present invention further includes the step of drying each applied layer of the integrated multilayer thin-film electronic device. The drying step can comprise any number of drying process including one or a combination of air dry, convective drying, ambient drying, heat treatment, annealing, quenching, or the like. In some embodiments, drying the applied layer includes heat treatment of the applied coating of the respective layer at a temperature of at least 60° C., preferably at least 70° C., more preferably at least 100° C., and yet more preferably at least 120° C.

In some embodiments, each applied coating/layer is air dried. In other embodiments, convective or forced drying techniques are used. In some embodiments, heat can be applied to encourage evaporation of the respective solvent. In some embodiments, a gas-quenching technique is used to rapidly dry the respective coating/layer. It should be appreciated that gas-quenching comprising the rapid cooling and drying of the applied layer(s) through the application of a drying gas, such as nitrogen, argon or other inert gas. In a preferred embodiment, high pressure nitrogen at room temperature is used for the gas-quenching step.

The first and second pattered layers comprise a patterned coating of discrete spaced apart sections. Each functional section of the second functional layer is positioned to overlay a subset of the total area of one electrode section of the first electrode layer, defining a plurality of spaced apart gap portions between adjacent functional sections within the second functional layer, each gap portion comprising the first electrode layer and first functional layer. It should be appreciated that overlaying comprises an overlap of the layered sections of the respective layer in the multilayer structure.

The first and second patterned coatings can have any suitable configuration. In embodiments, the first patterned coating comprises a plurality of spaced apart discrete first electrode sections, each electrode section comprising a geometric shape arranged in a regular pattern on the thin-film substrate. Each electrode section preferably has the same shape. In some embodiments, the first patterned coating comprises a tessellated pattern. In other embodiments, the first patterned coating is formed in a grid pattern. The second patterned coating preferably comprises a complimentary pattern to the first patterned coating. Nevertheless, it should be appreciated that in other embodiments that the electrode sections can have any shape, and do not need to be matched in shape across the individual layers.

In particular embodiments, the first patterned coating and second patterned coating comprise a plurality of spaced apart rectangular sections having a first longitudinal axis applied to a flexible strip having a second longitudinal axis aligned along the strip length, the rectangular sections being arranged on the flexible strip with the first longitudinal axis perpendicularly aligned to the second longitudinal axis.

The third patterned coating preferably comprises a complimentary pattern to the second patterned coating, and preferably the first patterned coating. In embodiments, the third patterned coating comprises a grid, preferably a grid formed from a regular repeating geometric shape. The grid can be formed from a series of spaced apart elements, preferably a plurality of spaced apart lines.

Variation of the configuration of the grid of the third patterned coating can be used to highlight sections of that grid. For example, the thickness of selected portions of the grid can be configured with a greater thickness compared to other portions of the grid to form a highlighted part or section of the grid. Those highlighted parts can be designed to form patterns within the grid, which when the grids are designed to have a contrasting shade and/or colour to the underlying layers, can produce a visual and/or visible pattern disenable to a viewer of the integrated multilayer thin-film electronic device. That visual and/or visible pattern can comprise a pattern, picture, indicia or the like. In embodiments, the thickness of selected portions of elements in the grid are thickener relative to the thickness of adjoining elements in the grid to produce the configuration of a selected indicia within the thicker elements of the grid. In embodiments where the grid is formed from a series of spaced apart lines, the width of selected portions of lines in the grid can be greater relative to the width of adjoining elements in the grid to produce the configuration of a selected indicia within the wider lines of the grid. Examples of selected indicia include logos, letters, numbers, symbols, patterns, rendered images, one or more words, signs, marks, emblems, tag, seal, stamp or the like. In certain embodiments, the thickness or width of the selected portions of elements in the grid are at least 1.5 time, preferably 2 times the thickness or width of adjoining elements in the grid. However, it should be appreciated that any suitable thickness or width difference may be used that provides a discernible rendering of the selected indicia.

In order to assist in rendering the selected indicia in the grid, the colour of the second electrode layer is preferably selected to contrast with the first functional layer and second functional layer. That colour is preferably selected to produce high-contrast lines relative to the colour of the first functional layer and second functional layer.

The thin-film substrate can comprise any suitable thin film onto which the multiple layers of the integrated multilayer thin-film electronic device can be applied. In embodiments, the thin-film substrate comprises a flexible substrate. It should be appreciated that the substrate may comprise at least one of a polymer, metal, ceramic or glass, preferably a polymer film. In embodiments, the thin-film substrate comprises indium tin oxide (ITO); polyethylene terephthalate (PET); or an ITO-PET substrate, preferably ITO patterned PET substrate. For example, the substrate can comprise a PET substrate with a 10 mm wide ITO pattern with 1 mm wide gaps. However, it should be appreciated that any suitable ITO pattern can be used.

The process of the present invention can be used for any solution-processed electronic devices such as organic transistors, OLEDs, organic memories and printed sensors. Although it is also applicable to some inorganic material based devices, layers fabricated by metal oxide particles are not re-dissolvable. Therefore, the application will be limited. The present invention finds particular application with photovoltaic and optoelectronic solar devices. Examples include Organic solar unit devices, OPV, perovskite solar unit devices, roll-to-roll.

As noted above, the integrated multilayer thin-film electronic device can have any number of functional layers. In embodiments, the substrate may include one or more layers or coatings selected from at least one of:

at least one coating of a transparent conductor layer;

at least one hole transporting layer comprising an organic or inorganic semiconductor; or at least one electron transporting layer comprising an organic or inorganic conductor.

The transparent conductor layer can be selected from transparent conductive oxides (TCO); multi-layer hybrid film; or polymer-based conductors. For example, transparent conductive oxides (TCO) can include tin doped indium oxide (ITO), fluoride-doped tin oxide (FTO), doped zinc oxide such as aluminium doped zinc oxide (AZO), or indium doped cadmium-oxide; multi-layer hybrid film can include TCO-metal-TCO; and polymer-based conductors includes poly(3,4-ethylenedioxythiophene and polystyrene sulfonate mixture (PEDOT:PSS) with and without metal grids.

A further aspect of the present invention provides an optoelectronic device formed using a process according to the first aspect of the present invention.

A second aspect of the present invention provides an integrated multilayer thin-film electronic device comprising:

- a first electrode layer on a thin film substrate comprising a first patterned coating that includes at least two spaced apart first electrode sections of adjacent unit devices;
- a first functional layer comprising a substantially continuous coating over the first electrode layer; and
- a second functional layer comprising a second patterned coating on the first functional layer comprising at least two spaced apart functional sections, each functional section positioned on the first functional layer to overlay a portion of one of the first electrode sections so to define a gap portion between adjacent functional sections that includes a portion of that first electrode section and the first functional layer; and
- a second electrode layer on the second functional layer comprising a third patterned coating that includes at least two spaced apart second electrode sections of adjacent unit devices, each second electrode section being positioned to overlay at least one functional section of the second functional layer and a portion of an adjoining gap portion that includes at least one portion of the first electrode section of an adjacent unit device,
- wherein each gap portion includes at least one electrically conductive path through the first functional layer between the first electrode and the second electrode of adjacent unit devices.

The at least one electrically conductive path between the first electrode and the second electrode of adjacent unit devices preferably comprises one or more micro- or nano-sized paths, preferably one or more micro- or nano-sized channel through the first functional layer, preferably one or more micro- to nano-sized paths or channels. In embodiments, the at least one electrically conductive path comprises a multitude of micro- to nano-sized paths or channels, in some cases millions of micro- to nano-sized paths or channels. In some embodiments, substantially all or all of the gap portion provides the conductive path between the first electrode and the second electrode.

The second aspect of the present invention therefore provides an integrated multilayer thin-film electronic device in which the electrical connection between the two spaced apart electrodes through the multilayer structure comprises at least one micro- or nano-sized electrically conductive path. This micro- or nano-sized electrically conductive path typically comprises a defect, for example a pinhole defect, through the relevant functional layer or layers.

It should be appreciated that the device of the second aspect of the present invention is preferable formed from a method according to the first aspect of the present invention. Accordingly, it should be understood that the features discussed in relation to the first aspect of the present invention can equally relate to similar features of this second aspect of the present invention.

Again, the first functional layer and the second functional layers preferably have different polarities. In embodiments, the first functional layer comprises a polar layer and the second functional layer comprise a non-polar layer. In other embodiments, the first functional layer comprises a non-polar layer and the second functional layer comprises a polar layer.

The at least one electrically conductive path between the first electrode and the second electrode of adjacent unit devices preferably comprises one or more channels, and more preferably one or more defects in the first functional layer. In embodiments, those defects can comprise one or more pinhole defects through the thickness of the first functional layer.

The gap portions between adjacent functional sections preferably comprise the first electrode layer and first functional layer only.

The first and second patterned coatings can have any suitable configuration. The first patterned coating preferably comprises a plurality of spaced apart discrete first electrode sections, each electrode section comprising a geometric shape arranged in a regular pattern on the thin-film substrate. Each electrode section preferably has the same shape. In embodiments, the first patterned coating comprises a tessellated pattern. The second patterned coating preferably comprises a complimentary pattern to the first patterned coating. However, it should be appreciated that in other embodiments that the electrode sections can have any shape, and do not need to be matched in shape across the individual layers.

In embodiments, the first patterned coating and second patterned coating comprise a plurality of spaced apart rectangular sections having a first longitudinal axis applied to a flexible strip having a second longitudinal axis aligned along the strip length, the rectangular sections being arranged on the flexible strip with the first longitudinal axis perpendicularly aligned to the second longitudinal axis.

The third patterned coating typically comprises a complimentary pattern to the second patterned coating, and preferably the first patterned coating. In embodiments the third patterned coating comprises a grid, preferably a grid formed from a regular repeating geometric shape. The grid is preferably formed from a series of spaced apart elements, preferably a plurality of spaced apart lines. The thickness of selected portions of elements in the grid can be configured to be thickener relative to the thickness of adjoining elements in the grid to produce the configuration of a selected indicia within the thicker elements of the grid. In embodiments where the grid is formed from a series of spaced apart lines, the width of selected portions of lines in the grid can be greater relative to the width of adjoining elements in the grid to produce the configuration of a selected indicia within the wider lines of the grid. In embodiments, the thickness or width of the selected portions of elements in the grid are at least 1.5 time, preferably 2 times the thickness or width of adjoining elements in the grid.

As previously explained, the colour of the second electrode layer is selected to contrast with the first functional layer and second functional layer, preferably to produce high-contrast lines relative to the colour of the first functional layer and second functional layer.

The thin-film substrate can comprise any suitable thin film onto which the multiple layers of the integrated multilayer thin-film electronic device can be applied. In embodiments, the thin-film substrate comprises a flexible substrate. It should be appreciated that the substrate may comprise at least one of a polymer, metal, ceramic or glass, preferably a polymer film.

The integrated multilayer thin-film electronic device can be used for any solution-processed electronic devices such as organic transistors, OLEDs, organic memories and printed sensors. Although it is also applicable to some inorganic material based devices, layers fabricated by metal oxide particles are not re-dissolvable. Therefore, the application will be limited.

The present invention finds particular application with photovoltaic and optoelectronic solar devices. Examples include Organic solar cells, OPV, perovskite solar cells, roll-to-roll. In some embodiments, the thin-film electronic device comprises a solution-processed electronic device such as organic transistors, OLEDs, organic memories and printed sensors.

The thin-film electronic device of the first or second aspect of the present invention preferably comprises an optoelectronic device, and more preferably a solution-processed photovoltaic device or photoactive sensor. The optoelectronic device can comprise a large range of photoactive devices such as photoelectric, photovoltaic and the like devices, including but not limited photovoltaic cells, photoactive sensors, including photodetectors, or the like.

An optoelectronic device according the present invention could therefore comprise a photoactive device, such as a photovoltaic cell, a photoactive sensor or a light emitting device. In some embodiments, the optoelectronic device can be selected from a photodiode; a phototransistor; a photomultiplier; a photo resistor; a photo detector; a light-sensitive detector; solid-state triode; a battery electrode; a light emitting device; a light emitting diode; a transistor; a solar cell; a laser; and a diode injection laser.

Where the integrated multilayer thin-film electronic device comprises an optoelectronic device, the first functional layer preferably comprises a photoactive layer. The photoactive layer may comprise at least one of an organic photovoltaic compounds, or a perovskite photo-active compounds. In embodiments, the photoactive layer may comprise at least one of one or more organic photovoltaic compounds, or one or more perovskite photo-active compounds. Furthermore, the second functional layer preferably comprises a charge selective layer. The charge selective layer can comprise at least one of: at least one electrode screening layer; at least one hole blocking layer; at least one electron blocking layer; at least one hole transporting layer; or at least one electron transporting layer. In embodiments, the second functional layer comprises at least one hole transporting layer.

The first electrode layer preferably comprises a transparent electrode layer. The second electrode layer preferably comprises a metallic electrode, and more preferably a silver electrode formed using a solution including the metal or ionic form of the metal and at least the first solvent.

The invention uses organic PV as an example. However, the invention can be used for other electronic devices and different order of polarities, for example perovskite photoactive layer/non-polar layer/polar conductive ink.

As used herein, the term "thickness" refers to the average thickness of a component of an optoelectronic device. The thickness of the various layers is generally tailored to the desired process and properties of the integrated multilayer thin-film electronic device. In embodiments, at least one of the first electrode layer, first functional layer, second functional layer or second electrode layer has a dry layer thickness of less than 1 μm, preferably from 100 nm to 600 nm, more preferably from 200 to 400 nm, more preferably from 300 to 400 nm, and yet more preferably about 300 nm.

The integrated multilayer thin-film electronic device can comprise various layers depending on the configuration of that device. In embodiments, the intermediary device includes at least one further functional layer between the first electrode layer and the second electrode layer, preferably between the first electrode layer and the second functional layer. In some embodiments, the integrated multilayer thin-film electronic device further includes at least one of: at least one further functional layer between the first and second functional layers; or at least one further functional layer between the first electrode layer and the first functional layer. Each further functional layer preferably comprises a patterned coating that includes at least two spaced apart second sections having a complementary configuration to the functional sections of the second functional layer. It should be appreciated that the "complementary configuration" relates to a complementary shape and/or pattern to the functional sections of the functional sections of the second function layer. In this sense, the at least one further functional layer the second functional layer is applied with a complementary and/or corresponding pattern to the second functional layers so to also define a similar and substantially corresponding gap portion to the gap portion of the second functional layer between adjacent functional sections within that further functional layer. This ensures that there is also a suitable gap in the further functional layers or layers for forming an electrical connection between spaced apart electrodes that can be utilised as previously discussed for the first aspect of the present invention.

In embodiments, the further functional layer comprises a further charge selective layer. The further charge selective layer can comprise at least one of: at least one electrode screening layer; at least one hole blocking layer; at least one electron blocking layer; at least one hole transporting layer; or at least one electron transporting layer. In embodiments, the further functional layer comprises a complementary charge selective layer to the second functional layer. For example, where the second function layer comprises at least one hole transporting layer, the further functional layer comprises an electron transporting layer. Similarly, where the second function layer comprises an electron transporting layer, the further functional layer comprises at least one hole transporting layer. Where the further functional layer comprises a further charge selective layer, that further charge selective layer is typically positioned between the first electrode and the first functional layer. In such embodiments, the first electrode layer is preferably a transparent electrode layer and the first functional layer is preferably a photoactive layer.

In embodiments, the substrate may include one or more layers or coatings selected from at least one of:

- at least one coating of a transparent conductor layer;
- at least one hole transporting layer comprising an organic or inorganic semiconductor; or
- at least one electron transporting layer comprising an organic or inorganic conductor.

Again, the transparent conductor layer can be selected from transparent conductive oxides (TCO); multi-layer hybrid film; or polymer-based conductors. For example, transparent conductive oxides (TCO) can include tin doped indium oxide (ITO), fluoride-doped tin oxide (FTO), doped zinc oxide such as aluminium doped zinc oxide (AZO), or indium doped cadmium-oxide; multi-layer hybrid film can include TCO-metal-TCO; and polymer-based conductors includes poly(3,4-ethylenedioxythiophene and polystyrene sulfonate mixture (PEDOT:PSS) with and without metal grids.

In some embodiments, the substrate can include one or more layers or coatings onto which the applied layer is applied. These coatings are preferably selected from at least one of:

- at least one coating of a transparent conductor layer;
- at least one electrode screening layer;
- at least one hole blocking layer;
- at least one electron blocking layer;

at least one hole transporting layer; or at least one electron transporting layer.

For example, the substrate can include the following coatings:

at least one coating of a transparent conductor layer and at least one hole transporting layer applied to the transparent conductor layer; or at least one coating of a transparent conductor layer and at least one electron transporting layer applied to the transparent conductor layer.

In another example, the substrate can include the following coatings:

at least one coating of a transparent conductor layer and at least one hole transporting layer applied to the transparent conductor layer; or at least one coating of a transparent conductor layer and at least one electrode screening layer applied to the transparent conductor layer.

The electrode screening material can be coated at a thickness of between 10 to 25 nm. The electrode-screening layer preferably comprises at least one hole blocking layer; or at least one electron blocking layer.

In some embodiments, the at least one hole transporting layer comprises an organic or inorganic semiconductor. In some embodiments, the at least one electron transporting layer comprises an organic or inorganic conductor.

The coatings applied to the substrate typically depend on the configuration of the photoactive device in which the applied photoactive layer forms part of. In a conventional structure of a photoactive device layer the substrate includes at least one coating of a transparent conductor layer and at least one hole transporting layer applied to the transparent conductor layer. In an inverted structure of a photoactive device layer the substrate includes at least one coating of a transparent conductor layer and at least one electron transporting layer applied to the transparent conductor layer. Of course, various other layers are possible depending on the desired structure of the photoactive device, as would be evident to one skilled in the art.

It should be appreciated that not all photoactive device structures will use TCO as the transparent conductor layer. For example, perovskite cells can be prepared on silicon solar cell to produce tandem solar cells. Furthermore, a printed conducting layer can be used instead of TCO. In some embodiments, a photoactive device including a photoactive layer made according to the present invention could be made directly on TCO. The present invention is intended to encompass all these embodiments.

The various layers can comprise a number of suitable components currently known in the art. For example:

Suitable transparent conductor layers can be selected from: transparent conductive oxides (TCO) include tin doped indium oxide (ITO), fluoride-doped tin oxide (FTO), doped zinc oxide such as aluminium doped zinc oxide (AZO), or indium doped cadmium-oxide; multilayer hybrid film can include TCO-metal-TCO; and polymer-based conductors includes poly(3,4-ethylenedioxythiophene and polystyrene sulfonate mixture (PEDOT:PSS) with and without metal grids;

Suitable hole transporting layers include a transparent conducting polymer such as at least one of Poly(3,4-ethylenedioxythiophene) (PEDOT), poly(3,4-ethylenedioxythiophene and polystyrene sulfonate mixture (PEDOT:PSS), poly(4,4-dioctylcyclopentadithiophene); Poly(3-hexylthiophene-2,5-diyl) (P3HT), Poly[bis(4-phenyl)(2,4,6-trimethylphenyl)amine] (PTAA), poly [N-9''-heptadecanyl-2,7-carbazole-alt-5,5-(4',7'-di-2-thienyl-2',1',3'-benzothiadiazole)] (PCDTBT), poly[2,6-(4,4-bis-(2-ethylhexyl)-4H-cyclopenta[2,1-b;3,4-b'] dithiophene)-alt-4,7(2,1,3-benzothiadiazole)] (PCPDTBT), poly(N-alkyldiketopyrrolopyrroledithienylthieno[3,2-b]thiophene) (DPP-DTT), 2,2(7,7(-tetrakis-(N,N-di-pmethoxyphenylamine)9,9(-spirobifluorene) (spiro-OMeTAD), $MoO_3$ or the like (with or without suitable dopants);

Suitable electron transporting layers include zinc oxide, titanium dioxide, tungsten trioxide, polyethylenimine ethoxylated (PEIE) or the like; and Suitable conductor layers comprise Au, Ag, C (for example graphite/carbon black, CNTs, vapour-grown carbon fibres graphene or the like), Al, Mg, Cu or suitable alloys thereof or the like.

In one particular embodiment, the integrated multilayer thin-film electronic device comprises a photovoltaic device comprising the following layers: flexible ITO (transparent electrode)/PEIE (electron selective layer)/PI-4 (photoactive layer—commercial photoactive ink)/5315 (hole selective layer—commercial PEDOT:PSS ink)/PV-416 (back electrode—commercial silver paste).

It should be appreciated that each of the layers can be applied in the integrated multilayer thin-film electronic device according to the method of the first aspect of the present invention as a solution, mixture, admixture, paste or the like in, with or in conjunction with an appropriate carrier solvent. That solvent is selected with the appropriate polarity to fit the differential orthogonal solubility of alternating material layers corresponding with the preferred alternating polarities of the layers. Suitable solvents include one or more of:

DMF, DMSO, Y-butyrolactone, acetone, acetyl acetone, ethyl acetoacetate, NMP, DMAC, THF or combinations thereof;

isopropanol, n-butanol, isobutanol, ethanol, methanol, acetic acid, ethylene glycol, propylene glycol, glycerol, allyl alcohol, propargyl alcohol, inositol or combinations thereof; or benzene, toluene, xylene, trimethylbenzenes (for example mesitylene), chlorobenzene, dichlorobenzene, chloroform, dichloromethane, anisole, propylene glycol methyl ether acetate, diethylene glycol mono butyl ether, di(propylene glycol) dimethyl ether or combinations thereof.

BRIEF DESCRIPTION OF THE FIGURES

The present invention will now be described with reference to the figures of the accompanying drawings, which illustrate particular preferred embodiments of the present invention, wherein.

DETAILED DESCRIPTION

The present invention describes a new way of forming electrical interconnections between two spaced apart electrodes in an integrated multilayer thin-film electronic device without having to include physical gaps in the patterning in the individual layers of that device.

Multilayer Thin-Film Electronic Device

The present invention relates to integrated multilayer thin-film electronic device and can be used for any solution-processed electronic devices such as organic transistors, OLEDs, organic memories and printed sensors. The present invention finds particular application with photovoltaic and optoelectronic solar devices such as include Organic solar cells, OPV, perovskite solar cells, roll-to-roll and will therefore be described in the context of those types of devices. However, it should be appreciated that the present invention can also relate to other solution-processed electronic device such as photoactive sensors, organic transistors, light emitting devices such as OLEDs, organic memories and printed sensors.

Figure 2:
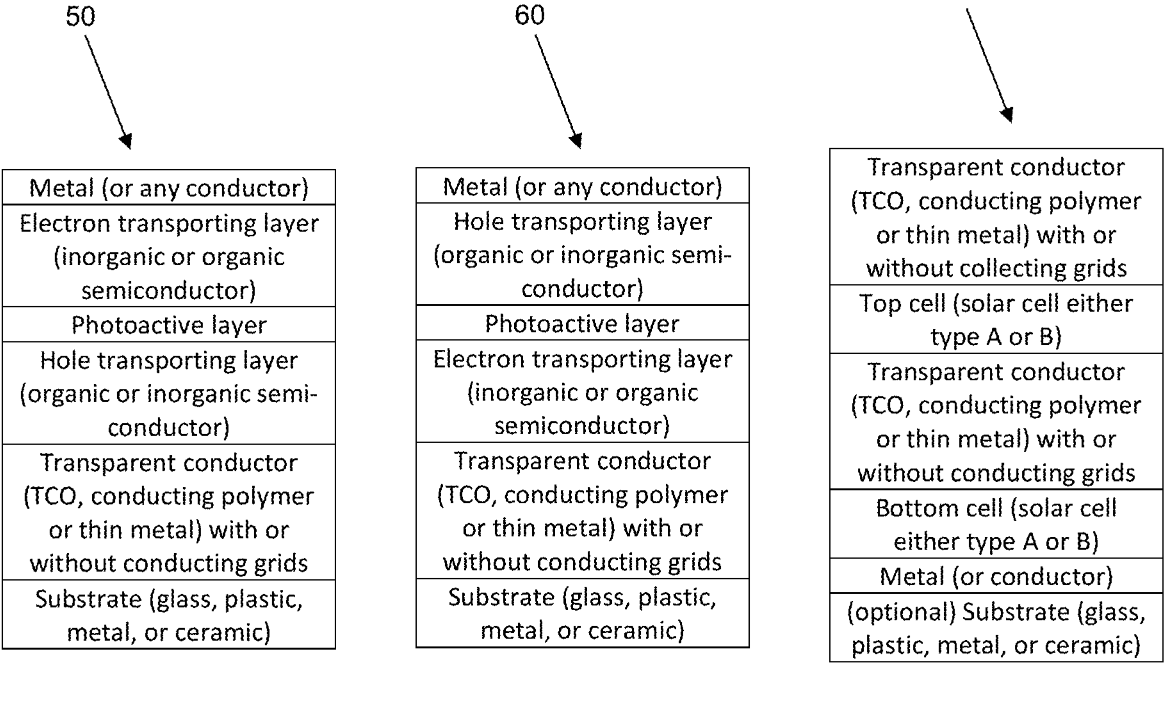
FIG. 2 illustrates the layers comprising a solar cell configured according to the present invention in (a) a conventional solar cell structure; (b) an inverted solar cell structure; and (b) a tandem solar cell structure.

Photovoltaic cells, particularly thin film and flexible solar cells are formed as a multilayer coating on a substrate. FIGS. 2(*a*) and 2(*b*) illustrate examples of layer structure of the multilayer organic solar cell configured according to an embodiment of the present invention. As shown in FIGS. 2(*a*) and 2(*b*), this multilayer coating structure can be arranged on the substrate in at least two different arrangements termed in the art as (A) a conventional structure 50, or (B) as an inverted structure 60 (FIG. 2(*b*)). The nature and order of the transporting layers—as well as the nature of the metal electrode—depends on whether the cell follows a regular or an inverted device architecture.

FIG. 2(*a*) represents a conventional structure 50 that is formed on a substrate having the following layers successively layered on a surface thereof: a transparent conductor (such as a transparent conductive oxide (TCO), conducting polymer or thin metal) with or without conducting grids, followed by a hole transporting layer; followed by the photoactive layer; followed by an electron transporting layer, and followed by a conductor layer (typically a metal).

FIG. 2(*b*) represents an inverted structure 60 that is formed on a substrate having the following layers successively layered on a surface thereof: a transparent conductor (such as a transparent conductive oxide (TCO), conducting polymer or thin metal) with or without conducting grids, followed by an electron transporting layer; followed by the photoactive layer; followed by a hole transporting layer, and followed by a conductor layer (typically a metal).

In an inverted structure 60, the electric charges exit the device in the opposite direction as in a normal device because the positive and negative electrodes are reversed. Inverted cells can utilize cathodes out of a more suitable material; inverted OPVs enjoy longer lifetimes than regularly structured OPVs, and they usually show higher efficiencies compared with the conventional counterparts.

It should be appreciated that the hole transporting layer or electron transporting layers could be omitted in some embodiments of the above conventional 50 and inverted 60 structures. These layers can therefore be optional in certain embodiments.

The solar cell may also comprise a tandem or multijunction solar cell 70. As shown in FIG. 2(*c*), a tandem structure is formed on a substrate using two stacked solar cell structures, i.e. a top cell and a bottom cell of the conventional or inverted structure. The stacked structure includes two different solar cells of the same or different configurations. The example provided comprises the following layers successively layered thereon: Transparent conductor layer (TCO, conducting polymer or thin metal) with or without collecting grids; followed by a Top cell—a solar cell either type A (FIG. 1A) or type B (FIG. 2B); followed by a Transparent conductor layer (TCO, conducting polymer or thin metal) with or without conducting grids; followed by a Bottom cell (a solar cell either type A (FIG. 2A) or type B (FIG. 2B); followed by a Metal (or conductor) layer. A substrate such as glass, plastic, metal or ceramic could also be used but should be understood to be optional.

Each layer can be formed by one of a number of coating techniques known in the art including casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, or dip coating. It should be appreciated that a person skilled in the art would be able to adopt a suitable technique to apply each layer based on techniques known in the art.

The various layers can comprise a number of suitable components currently known in the art. Examples include:

- Suitable photoactive layers can be selected from one or more organic photovoltaic compounds, or one or more perovskite photo-active compounds.
- Suitable transparent conductor layer can be selected from transparent conductive oxides (TCO) include tin doped indium oxide (ITO), fluoride-doped tin oxide (FTO), doped zinc oxide such as aluminium doped zinc oxide (AZO), or indium doped cadmium-oxide; multi-layer hybrid film (TCO-metal-TCO for example); polymer-based conductors includes poly(3,4-ethylenedioxythiophene and polystyrene sulfonate mixture (PEDOT:PSS) with and without metal grids;
- Suitable hole transporting layers include a transparent conducting polymer such as at least one of Poly(3,4-ethylenedioxythiophene) (PEDOT), poly(3,4-ethylenedioxythiophene and polystyrene sulfonate mixture (PE- DOT:PSS), poly(4,4-dioctylcyclopentadithiophene); doped P3HT (Poly(3-hexylthiophene-2,5-diyl)) or the like;

Suitable electron transporting layers include zinc oxide, titanium dioxide, tungsten trioxide, Polyethylenimine ethoxylated (PEIE) or the like;

Suitable conductor layers comprise aluminium, silver, magnesium, copper, gold, or suitable alloys thereof or the like; and Suitable substrates include metals, polymers, ceramics, or glasses.

It should be appreciated that typically electron transporting layers are hole blocking layers or vice versa. Similarly, typically electron blocking layers are hole transporting layers or vice versa. Vacuum-based OLEDs tend to use additional layers (injecting layer, blocking layer) to push the efficiency further. Solution processed devices typically do not use such additional layers.

The photoactive layer can comprise one or more organic photoactive compounds in some embodiments. Preferably, the organic photoactive compounds are in the form of an ink. Organic photoactive layer generally comprises a combination of an electron donor material and an electron acceptor material. In some embodiments, the organic photoactive compounds comprise an organic photoactive layer composite ink comprising at least one electron donor material, at least one electron acceptor material, and an organic solvent. Other components may also be present to enhance the functionality of the photoactive layer, for example as taught in United States patent publication No. US20190393423A1 which teaches an organic photoactive layer comprising an electron donor material, an electron acceptor material, an organic solvent and an organic amine compound, the contents of which should be understood to be incorporated into this specification by this reference.

The electron donor material refers to a semiconductor material whose molecule can give electrons in an organic solar cell photoactive layer under the condition of light excitation so as to achieve charge separation. In some embodiments, the electron donor material comprises a conjugated polymer electron donor material and/or a conjugated small organic molecule electron donor material.

In embodiments, the conjugated polymer electron donor material comprises any one or a combination of two or more of P3HT (poly(3-hexylthiophene)), PTB7, PTB7-Th, PffBT4T-2OD and structure variants thereof, but is not limited thereto. The conjugated small organic molecule electron donor material preferably comprises a macromolecule based on benzodithiophene (BDT) as a core and a macromolecule based on oligothiophene as a core. For example, the conjugated small organic molecule electron donor material comprises DR3TSBDT, DRCN7T and structure variants thereof.

The electron acceptor material refers to a semiconductor material whose molecule can receive electrons in an organic solar cell photoactive layer under the condition of light excitation so as to achieve charge separation. In some embodiments, the electron acceptor material comprises any one or a combination of two or more of a fullerene electron acceptor material, a fullerene derivative electron acceptor material and a non-fullerene electron acceptor material, but is not limited thereto.

In embodiments, the fullerene electron acceptor material and the fullerene derivative electron acceptor material comprise any one or a combination of two or more of PCBM such as [6,6]-phenyl-C61-methyl butyrate (PC61BM) or PC71BM, Bis-PC61 BM and IC61BA, but is not limited thereto. The non-fullerene electron acceptor material preferably comprises an organic conjugated electron acceptor material. More preferably, the organic conjugated electron acceptor material comprises any one or a combination of two or more of a perylene diimide (PDI) derivative, a naphthdiimide (NDI) derivative, an indacene derivative, a fluorene derivative, a benzothiadiazole (BT) derivative and a subphthalocyanine (SubPc) derivative, but is not limited thereto.

The organic solvent preferably includes, but is not limited to, o-dichlorobenzene, chlorobenzene, chloroform, toluene, xylene, trimethylbenzene, and the like.

Examples of suitable organic photoactive compounds include P3HT:PCBM or PI-4 (commercial active layer ink from infinityPV (Jyllinge, Denmark)), PBF-QxF:Y6 D18:Y6, or D18:Y6:PCBM.

In other embodiments, the photoactive layer can comprise one or more perovskite photoactive compounds. The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $AMX_3$, wherein A and M are cations of different sizes and X is an anion. M is selected from Pb, Sn, Ge, Ca, Sr, Cd, Cu, Ni, Mn, Co, Zn, Fe, Mg, Ba, Si, Ti, Bi, or In and X is selected from at least one of F, Cl, Br or I. In many embodiments, M comprises a metal cation, and more preferably a divalent metal cation such as $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$, and $Eu^{2+}$. In some embodiments, the second cation may be selected from $Sn^{2+}$, $Pb^{2+}$ and $Cu^{2+}$. In preferred embodiments, M is selected from Pb, Sn, Ge, Si, Ti, Bi, or In.

In the unit cell, the A cations are at (0,0,0), the M cations are at (1/2, 1/2, 1/2) and the X anions are at (1/2, 1/2, 0). The A cation is usually larger than the M cation. The skilled person will appreciate that when A, M and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the K2 iF4-type structure comprises a layer of perovskite material.

The perovskite semiconductor employed in the present invention is typically one which is capable of (i) absorbing light, and thereby generating free charge carriers; and/or (ii) emitting light, by accepting charge, both electrons and holes, which subsequently recombine and emit light. Thus, the perovskite employed is typically a light-absorbing and/or a light-emitting perovskite. The perovskite semiconductor employed in the present invention may therefore be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped.

In some embodiments, A in $AMX_3$ comprises an organic cation having the formula $(R_1R_2R_3R_4N)$, wherein:

$R_1$ is hydrogen, unsubstituted or substituted C1-C20 alkyl, or unsubstituted or substituted aryl;

$R_2$ is hydrogen, unsubstituted or substituted C1-C20 alkyl, or unsubstituted or substituted aryl;

$R_3$ is hydrogen, unsubstituted or substituted C1-C20 alkyl, or unsubstituted or substituted aryl; and $R_4$ is hydrogen, unsubstituted or substituted C1-C20 alkyl, or unsubstituted or substituted aryl.

In some embodiments, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance, $R_1$ may be hydrogen or methyl, $R_2$ may be hydrogen or methyl, $R_3$ may be hydrogen or methyl, and $R_4$ may be hydrogen or methyl. In some embodiments, F can be a substituent of the alkyl chain attached to N or the sub-alkyl chain from the N.

In some embodiments, A in $AMX_3$ comprises an organic cation having the formula ($R_5R_6N{=}CH{-}NR_7R_8$), and wherein:

$R_5$ is hydrogen, unsubstituted or substituted C1-C20 alkyl, or unsubstituted or substituted aryl;

$R_6$ is hydrogen, unsubstituted or substituted C1-C20 alkyl, or unsubstituted or substituted aryl;

$R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl.

Alternatively, the organic cation may have the formula $(R_5NH_3)^+$ wherein: $R_5$ is hydrogen, or unsubstituted or substituted C1-C20 alkyl. For instance, $R_5$ may be methyl or ethyl. Typically, $R_5$ is methyl.

In some embodiments, the organic cation has the formula $R_5R_6N{=}CH{-}NR_7R_8$ wherein: $R_5$ is hydrogen, unsubstituted or substituted C1-C20 alkyl, or unsubstituted or substituted aryl; $R_6$ is hydrogen, unsubstituted or substituted C1-C20 alkyl, or unsubstituted or substituted aryl; $R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl. Typically, $R_5$ in the cation is hydrogen, methyl or ethyl, $R_6$ is hydrogen, methyl or ethyl, $R_7$ is hydrogen, methyl or ethyl, and $R_8$ is hydrogen, methyl or ethyl. For instance, $R_5$ may be hydrogen or methyl, $R_6$ may be hydrogen or methyl, $R_7$ may be hydrogen or methyl, and $R_8$ may be hydrogen or methyl. The organic cation may, for example, have the formula $(H_2N{=}CH{-}NH_2)^+$.

As used herein, an alkyl group can be a substituted or unsubstituted, linear or branched chain saturated radical, it is often a substituted or an unsubstituted linear chain saturated radical, more often an unsubstituted linear chain saturated radical. A C1-C20 alkyl group is an unsubstituted or substituted, straight or branched chain saturated hydrocarbon radical. Typically, it is C1-C10 alkyl, for example methyl, ethyl, propyl, butyl, pentyl, hexyl, heptyl, octyl, nonyl or decyl, or C1-C6 alkyl, for example methyl, ethyl, propyl, butyl, pentyl or hexyl, or C1-C4 alkyl, for example methyl, ethyl, i-propyl, n-propyl, t-butyl, s-butyl or n-butyl.

When an alkyl group is substituted it typically bears one or more substituents selected from substituted or unsubstituted C1-C20 alkyl, substituted or unsubstituted aryl (as defined herein), cyano, amino, C1-C10 alkylamino, di(C1-C10)alkylamino, arylamino, diarylamino, arylalkylamino, amido, acylamido, hydroxy, oxo, halo, carboxy, ester, acyl, acyloxy, C1-C20 alkoxy, aryloxy, haloalkyl, sulfonic acid, sulfhydryl (i.e. thiol, —SH), d-C10 alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a C1-C20 alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, Ph-$CH_2CH_2$—), styryl (Ph-CH═CH—), cinnamyl (Ph-CH═CH—$CH_2$—). Typically, a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from C1-C6 alkyl which is unsubstituted (to form an aralkyl group), aryl which is unsubstituted, cyano, amino, C1-C10 alkylamino, di(C1-C10)alkylamino, arylamino, diarylamino, arylalkylamino, amido, acylamido, hydroxy, halo, carboxy, ester, acyl, acyloxy, C1-C20 alkoxy, aryloxy, haloalkyl, sulfhydryl (i.e. thiol, —SH), C1-10 alkylthio, arylthio, sulfonic acid, phosphoric acid, phosphate ester, phosphonic acid and phosphonate ester and sulfonyl. Typically, it carries 0, 1, 2 or 3 substituents. A substituted aryl group may be substituted in two positions with a single C1-C6 alkylene group, or with a bidentate group represented by the formula —X—(C1-C6)alkylene, or —X—(C1-C6) alkylene-X—, wherein X is selected from 0, S and R, and wherein R is H, aryl or C1-C6 alkyl. Thus, a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically, it carries 0, 1, 2 or 3 substituents.

The perovskite semiconductor layer of the invention typically comprises at least one anion X selected from halide anions and chalcogenide anions. The term "halide" refers to an anion of a group 7 element, i.e., of a halogen. Typically, halide refers to a fluoride anion, a chloride anion, a bromide anion, an iodide anion or an astatine anion. The term "chalcogenide anion", as used herein refers to an anion of a group 6 element, i.e. of a chalcogen. Typically, chalcogenide refers to an oxide anion, a sulphide anion, a selenide anion or a telluride anion. In preferred embodiments, the anion X is selected from at least one of F, Cl, Br or I.

In some embodiments, the perovskite layer comprises an organo-metal halide perovskite. In these embodiments, the first cation A is an organic cation, more preferably an ammonium group or other nitrogen containing organic cation. This organic cation (A) in this type of perovskite can comprise a large number of organic cations including protonated alkylamines, cycloalkylamines (such as pyrrolidine or cyclohexyl amine) arylamines and aromatic heterocycles (such as pyridine). In some embodiments, A comprises cations having the general formula $RCH_2NH_3^+$, $RC(NH_2)_2^+$, $R_aR_bCH_1NH_3^+$, $R_aR_bR_cCNH_3^+$, $R_aR_bNH_2^+$, or $R_aR_bR_cNH^+$, where R, $R_a$, $R_b$, $R_c$ comprises H or a substituted or unsubstituted alkyl group or groups, preferably a $C_1$ to $C_6$ substituted or unsubstituted alkyl or aryl group or groups. Whilst a number of organo-metal halide perovskite are possible, preferred A of a perovskite compound comprises at least one of $CH_3NH_3^+$, or $HC(NH_2)_2^+$.

The resulting perovskite layer preferably comprises an organo-metal halide perovskite. For example, in some embodiments the perovskite layer comprises at least one of $CH_3NH_3MX_3$ or $HC(NH_2)_2MX_3$, in which, M is selected from Pb, Sn, TI, Bi, or In; and X is selected from at least one of F, Cl, Br or I. In other embodiments, the perovskite comprises an organo-lead halide perovskite, preferably comprising at least one of $CH_3NH_3PbX_3$ or $HC(NH_2)_2PbX_3$, in which X is selected from at least one of F, Cl, Br or I.

In some embodiments, in the optoelectronic device of the invention, the perovskite is a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ or $CH_3NH_3SnF_2Cl$.

Of course, X does not necessarily need to be a single halide. The resulting perovskite layer can include a mixed halide perovskite wherein X in $CH_3NH_3MX_3$ or $HC(NH_2)_2MX_3$ comprises two or more of F, Cl, Br or I. Accordingly, $CH_3NH_3MX_3$ could comprise $CH_3NH_3MCl_xI_{3-x}$, $CH_3NH_3MI_{3-x}Cl_x$ or similar. It should be appreciated that $CH_3NH_3MCl_xI_{3-x}$, $CH_3NH_3MI_{3-x}Cl_x$ or similar can comprise non-stoichiometric materials in which M is selected from at least one of Pb, Sn, Ge, Si, Ti, Bi, or In, preferably M is Pb. In an exemplary embodiment, the perovskite layer is one of the family $CH_3NH_3PbCl_xI_{3-x}$. In preferred embodiments, x is close to zero (i.e. very small chloride content). In other embodiments, x=0 providing a tri-iodide perovskite material layer.

Process of Forming Integrated Multilayer Thin-Film Electronic Device

The integrated multilayer thin-film electronic device of the present invention consists of multiple layers of functional materials, including conductors and semi-conductors. As previously discussed, one of the important factors in forming a multilayer electronic device is consideration of the orthogonal solubility of alternating materials in each layer. For example, a water/alcohol-based ink (polar materials) can be deposited on the layer fabricated from an organic solvent-based ink (non-polar materials) without redissolving underlying layer. The process can repeat and form a multilayer with alternating polarity—i.e. polar/non-polar/polar/non-polar materials.

If an organic-solvent-based conducting paste is deposited on top of the organic thin-film layer, the thin film will be damaged, lose the function and form a conducting channel through the layer. The phenomenon has been the major failure mechanism of printed PV when the interlayer (polar material) has physical defects (i.e. short-circuit formation through pinholes of the water-soluble charge-selective layer).

The present invention strategically uses the differences in the orthogonal solubility of the different layers in the multilayer structure of a thin-film electronic device to utilise the solubility of at least one layer of that structure to create a create at least one electrically conductive path through a functional layer that is located between the first electrode and the second electrode of adjacent cells (unit devices). Whilst not wishing to be limited to any one theory, the Inventors have utilised the problematic short-circuit formation through organic layers to create conducting paths for electrode interconnections. This alternate interconnection configuration replaces layer patterning for at least one of the functional layers enabling at least one unpatterned organic layer to be used to fabricate modules.

Figure 1:
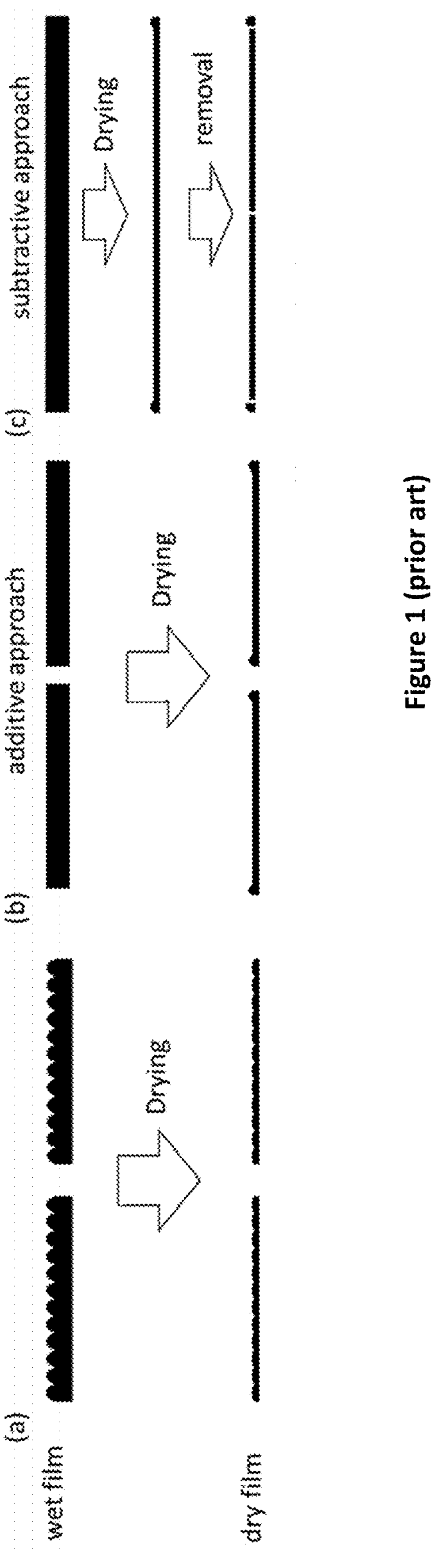
FIG. 1 provides a schematic showing a comparison of three prior art approaches to forming an electrode interconnection in an integrated multilayer thin-film electronic device.

The present invention can therefore take advantages of the unpatterned coating and scribing approach shown in FIG. 1(*c*) (described in the background to the invention section) without requiring costly scribing system.

In photovoltaic or optoelectronic devices, the unpatterned coating is preferable the photoactive layer. The removal of the patterning requirement for the photo-active layer solves many challenges associated in the manufacturing of printed PV and provides design freedom which will create more market opportunities.

Figure 3:
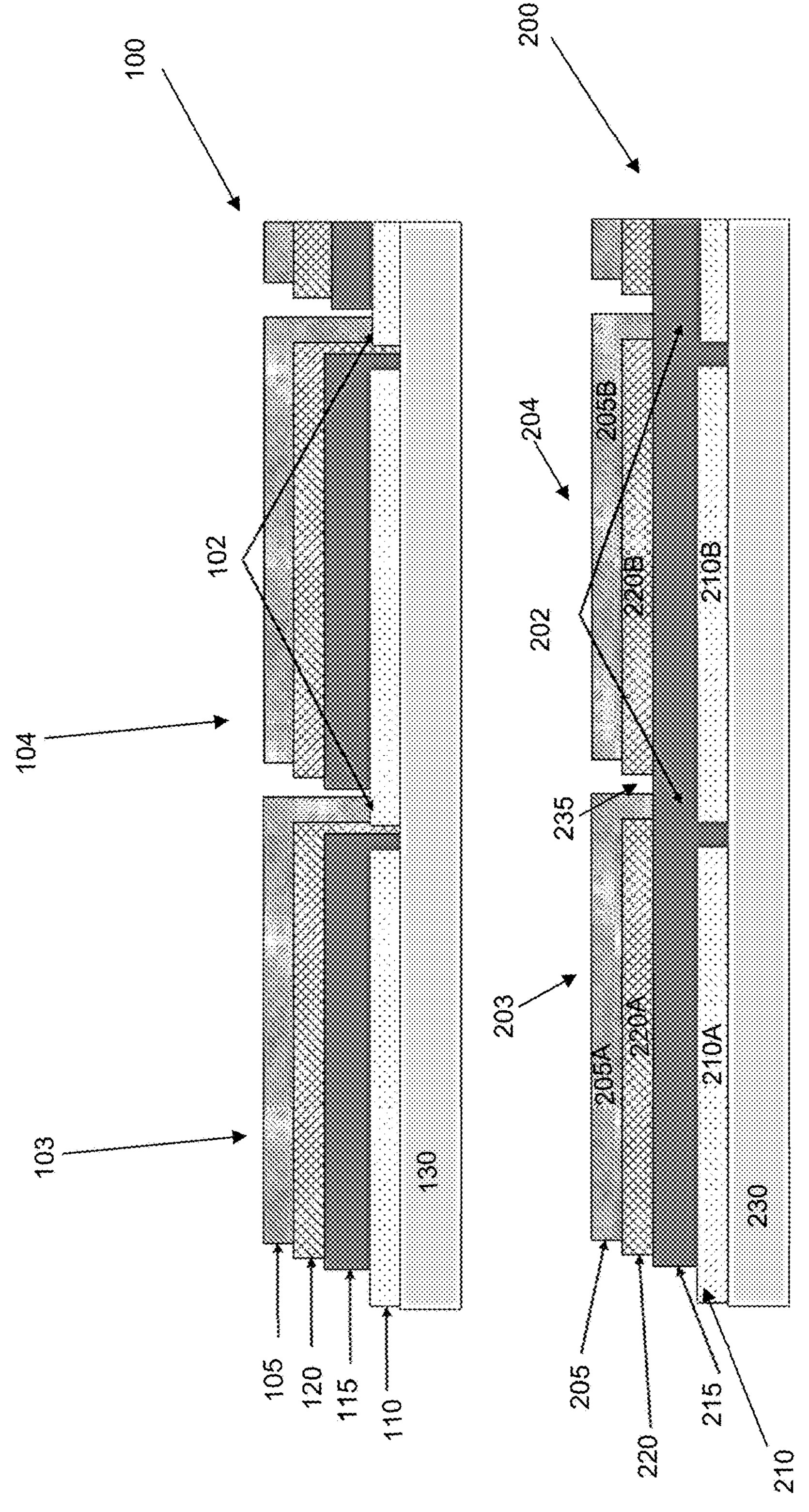
FIG. 3 provides a schematic drawing of series-connected photovoltaic (PV) modules showing: (a) conventional module via patterned photo-active layers. (b) module design developed in this invention. An unpatterned photo-active layer is used and inter connections are formed via self-generated electrical paths.

FIG. 3 illustrates the different in configuration between a photoactive device 100 formed using a prior art method using the one of the prior art methods shown in FIG. 1—as shown in Figure (a); and a photoactive device 200 formed using a method according to the present invention. The prior art photoactive device shown in FIG. 3(*a*) includes a patterned photoactive layer, formed using printing, patterning or scribing as previously described on substrate 130. The electrical inter-unit device connection 102 between the back electrode 105 of a first cell (unit device) 103 and transparent electrode 110 of a second cell (unit device) 104 is formed through a patterned gap formed in the photoactive layer 115 and the charge selective layer 120. In comparison, the photoactive device 200 configured according to the present invention (as shown in FIG. 3(*b*)) includes an unpatterned photoactive layer 215. The electrical inter-unit device connection 202 between the back electrode 205 of a first unit device 203 and transparent electrode 210 of a second unit device 204 is formed through a patterned gap formed in the charge selective layer 220 and at least one micro- or nano-sized electrically conductive path through the unpatterned photoactive layer 215.

The patterned charge-selective layer 220 along with the differential orthogonal solubility of the charge-selective layer 220 and photoactive layer 215 is used to control selective formation of the one micro- or nano-sized electrically conductive paths through the unpatterned photoactive layer 215 when applying the different layers of the multilayered photoactive device 200.

The process of forming this electrode interconnection i.e. the electrical inter-cell connection 202 between the back electrode 205 of a first cell 203 and transparent electrode 210 of a second cell 204 is achieved using the following general steps:

1. The transparent electrode layer 210 is applied on a thin film substrate 230 as a first patterned coating that includes at least two spaced apart first electrode sections 210A and 210B of adjacent cells 203 and 204, formed as rectangles in FIG. 3;
2. The photoactive layer 215 is applied over the transparent electrode layer 210 as a substantially continuous coating; and
3. The charge selective layer 220 is applied over the photoactive layer 215 as a patterned coating. The pattern generally comprises at least two spaced apart functional sections 220A and 220B (formed as rectangles in FIG. 3), each functional section 220A and 220B is patterned to be positioned on the photoactive layer 215 to overlay a portion of one of the first electrode sections 210A and 210B so to define a gap portion 235 between adjacent functional sections 220A and 220B that includes a portion of that first electrode section 210 and the transparent electrode layer 210.

These steps produce an intermediary device that comprises the patterned transparent electrode layer 210, substantially continuous photoactive layer 215 and patterned charge selective layer 220. The photoactive device 200 is completed by applying a back electrode 205 as a patterned coating in the following step:

4. The back electrode 205 is applied over the charge selective layer 220 as a third patterned coating that includes at least two spaced apart second electrode sections 205A and 205B, each second electrode section 205A, 205B being positioned to overlay at least one functional section 220A and 220B of the charge selective layer 220 and a portion of an adjoining gap portion 235 that includes at least one portion of the first electrode section 210A and 210B of an adjacent cell 203 and 204. The back electrode 205 is formed using a solution including a conductive species and at least a first solvent. In this set up, the gap portion 235 between adjacent functional sections preferably comprises the transparent electrode layer 210 and photoactive layer 215 only.

The layers and solvents are selected to have differential orthogonal solubility of alternating material layers, such that the photoactive layer 215 is soluble in the first solvent and the charge selective layer 220 has a low to zero solubility in the first solvent. The photoactive layer 215 and the charge selective layer 220*s* are formulated to have different polarities, with the first solvent having the same polarity as the photoactive layer 215. Thus, where the photoactive layer 215 is a polar layer, the first solvent is a polar solvent. Where the photoactive layer 215 is a non-polar layer, the first solvent is a non-polar solvent. The charge selective layer 220 is a different polarity to the photoactive layer 215.

In embodiments, the first solvent comprises:

A. DMF, DMSO, Y-butyrolactone, acetone, acetyl acetone, ethyl acetoacetate, NMP, DMAC, THF or combinations thereof;

B. isopropanol, n-butanol, isobutanol, ethanol, methanol, acetic acid, ethylene glycol, propylene glycol, glycerol, allyl alcohol, propargyl alcohol, inositol or combinations thereof; or C. benzene, toluene, xylene, trimethylbenzenes (for example mesitylene), chlorobenzene, dichlorobenzene, chloroform, dichloromethane, anisole, propylene glycol methyl ether acetate, diethylene glycol mono butyl ether, di(propylene glycol) dimethyl ether or combinations thereof.

Again, it should be appreciated that selection of the first solvent depends on the required polarity and the composition of the various layers. Where the integrated multi-layer thin film electronic device comprises an optoelectronic device, and in particular a photovoltaic device, selection of the first solvent depends on the composition of the photovoltaic layer. For perovskite devices, the first solvent is preferably selected from either A or B above depending on the polarity of that layer. For organic PV devices, the first solvent is preferably selected from C above.

The first solvent from the applied composition of the back electrode layer 205 dissolves at least part of the photoactive layer 215 in the gap portion 235, to form an electrical interconnect between the transparent electrode layer 210 and back electrode 205 through the photoactive layer 215. In contrast, the charge selective layer 220 is not affected by the first solvent and does not dissolve on application of the back electrode 205, remaining substantially intact (defect free) when the back electrode 205 is applied. Therefore, application of the back electrode 205 to the gap portion 235 forms one or more (typically a multitude) of micro- to nano-sized electrically conductive paths through the photoactive layer 215 between the back electrode 205 of a first cell 203 and transparent electrode 210 of a second cell 204.

The present invention therefore provides an alternative process for forming an electrical connection between spaced apart electrodes through the functional layers of an integrated multilayer thin-film electronic device by utilising the selective solubility of components of the multilayer film with the solvent used to form the back electrode 205.

Whilst only two adjacent cells (unit devices) are illustrated in FIG. 3, it should be appreciated that the photoactive device 200 in FIG. 3 typically comprises a series of adjacent cells on the thin film substrate and may also be arranged in a module. Each adjacent cell can include an interconnect formed according to the present invention.

Whilst not illustrated, the electrical inter-cell connection 202 is typically formed from a number of nano- to micro-sized channels in the photoactive layer 215. As explained above, these typically comprise one or more defects in the photoactive layer 215, such as a pinhole defect through the thickness of the photoactive layer 215. Typically, the process forms a large number of nano- to micro-paths or channels. In most cases, this conductive path comprises millions of nano- to micro-channels through the photoactive layer 215. For example, a whole area of a 2 mm×100 mm line can be a conductive path, depending on the active layer and conducting paste. In some cases, the whole layer (the photoactive layer 215 uncovered by the charge selective layer 220) can be uniformly conductive. Each of the nano- to micro-paths or channels are distributed through, along and about the photoactive layer 215.

The composition of the various layers depends on the configuration of the photoactive device 200. As discussed above, the photoactive layer 215 may comprise at least one of one or more organic photovoltaic compounds, or one or more perovskite photo-active compounds, the possible compositions of which are also discussed above. Furthermore, the charge selective layer 220 can comprise at least one of: at least one electrode screening layer; at least one hole blocking layer; at least one electron blocking layer; at least one hole transporting layer; or at least one electron transporting layer, again, the possible compositions of which are also discussed above. In some embodiments, the charge selective layer 220 comprises a hole transporting layer, for example poly(3,4-ethylenedioxythiophene and polystyrene sulfonate mixture (PEDOT:PSS). The transparent electrode layer 210 can comprise any suitably configurable conductive species, for example tin doped indium oxide (ITO), fluoride-doped tin oxide (FTO), doped zinc oxide such as aluminium doped zinc oxide (AZO), or indium doped cadmium-oxide. And finally, the back electrode 205 preferably comprises a metallic electrode, and more preferably a silver electrode formed using a solution including the metal or ionic form of the metal and the first solvent (as discussed above). It should be appreciated that the above compositions should not be limiting on the invention, and other suitable compositions are possible as discussed throughout this specification.

It also should be appreciated that further layers can be included in the multilayer structure of the device 200 in addition to the layers shown in the device 200 illustrated in FIG. 3. For example, a further charge selective layer (one of a hole transporting layer or an electron transporting layer depending on the configuration of the photoactive device, as illustrated and described in relation to the devices 50, 60 and 70 illustrated in FIG. 2) could be included between the transparent electrode layer 210 and the photoactive layer 215, for example as shown the devices 50 and 60 illustrated in FIGS. 2(*a*) and (*b*)). This further charge selective layer would be applied as a fourth patterned coating having a complementary and corresponding pattern to the second patterned coating of the charge selective layer 220 is applied over the photoactive layer 215, also defining a complementary and corresponding gap portion 235 to provide the required overlap of the back electrode 205 of a first cell 203 and transparent electrode 210 of a second cell 204 to facilitate the electrically conductive path through the photoactive layer 215 between these two electrodes.

It should be appreciated that each of the layers described above in relation to the devices 50, 60 and 70 illustrated and described in relation to FIGS. 2(*a*), 2(*b*) and 2(*c*) and device 200 in FIG. 3 can be applied in the integrated multilayer thin-film electronic device to form the device (see below) as a solution, mixture, admixture, paste or the like in, with or in conjunction with an appropriate carrier solvent. That solvent is selected with the appropriate polarity to fit the differential orthogonal solubility of alternating material layers corresponding with the preferred alternating polarities of the layers. Suitable solvents include:

DMF, DMSO, Y-butyrolactone, acetone, acetyl acetone, ethyl acetoacetate, NMP, DMAC, THF or combinations thereof; or isopropanol, n-butanol, isobutanol, ethanol, methanol, acetic acid, ethylene glycol, propylene glycol, glycerol, allyl alcohol, propargyl alcohol, inositol or combinations thereof.

As previously discussed, the various layers can be applied to form the integrated multilayer thin-film electronic device 200 using a variety of application techniques. In some embodiments, at least one of the transparent electrode layer 210, photoactive layer 215, charge selective layer 220 or back electrode 205 is applied to the substrate using at least one of: casting, doctor blading, printing, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, or dip coating.

Each applied layer of the integrated multilayer thin-film electronic device 200 can also undergo a drying process/step to assist the layer drying. The drying step can comprise any number of drying process including one or a combination of air dry, convective drying, ambient drying, heat treatment, annealing, quenching, or the like. In some embodiments, drying the applied layer includes heat treatment of the applied layer at a temperature of at least 60° C., preferably at least 70° C., more preferably at least 100° C., and yet more preferably at least 120° C.

Design Freedom for High Performance and Aesthetics

The key advantage of solution-processed thin-film electronic devices is the potential manufacturing by low-cost roll-to-roll printing. Roll-to-roll production of printed organic PV has been previously demonstrated by several groups, including the Applicant.

Figure 4:
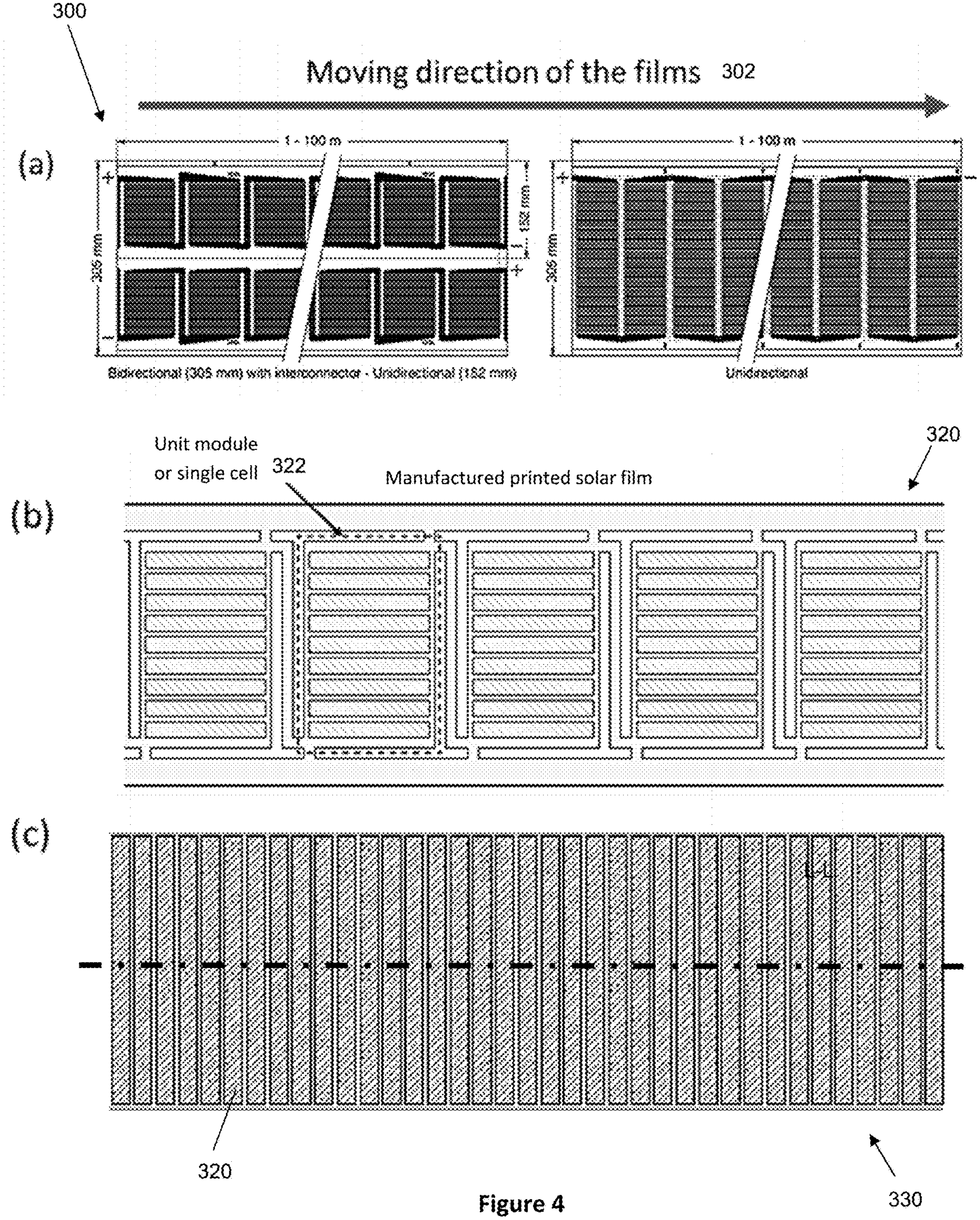
FIG. 4 illustrates example designs of PV modules processed by roll-to-roll production that could be produced using the process of the present invention, including (a) Infinity PV module, (b) CSIRO's smart module and (c) CSIRO's perpendicular-module design.

FIGS. 4(*a*) and 4(*b*) show examples of roll-to-roll produced printed PV, with the film movement direction going from left to right in the Figures, as shown by arrow 302. The design 300 shown in FIG. 4(*a*) shows series-connected module designs developed by InfinityPV. This design allows "cut-to-size" for the required output voltage. The design 320 shown in FIG. 4(*b*) provides the freedom to set output voltage and current. The devices shown in FIGS. 4(*a*) and 4(*b*) can be produced using the method of the present invention.

Although the modules offer flexibility and advantages over conventional rigid solar cells, cells are made in "parallel" to the production direction due to the limitation of the production method. Such designs require inter-module linkers/gaps for large-area applications and result in GFF loss due to the non-active areas.

The interconnection produced using the method of the present invention allows greater flexibility in device design, such as the device 330 in FIG. 4(*c*). The device shown in FIG. 4(*c*) is patterned with cells 332 configured as laterally spaced apart rectangles positioned lengthwise perpendicular to the longitudinal axis L-L of the longitudinal length of the substrate film on which the cells 332 are printed, producing a module with the perpendicular cell design. Series connections between adjacent cells 332 can be made infinitely throughout the film using the interconnection process of the present invention without area-loss for the inter-module connections. Any part of the film can be cut for the required application area or output voltage. If all modules have the same cell-area efficiency, the module with the perpendicular design would have higher power output compared to conventional layout (for example as shown in FIGS. 4(*a*) and 4(*b*)) simply due to a larger fraction of cell-area.

Figure 5:
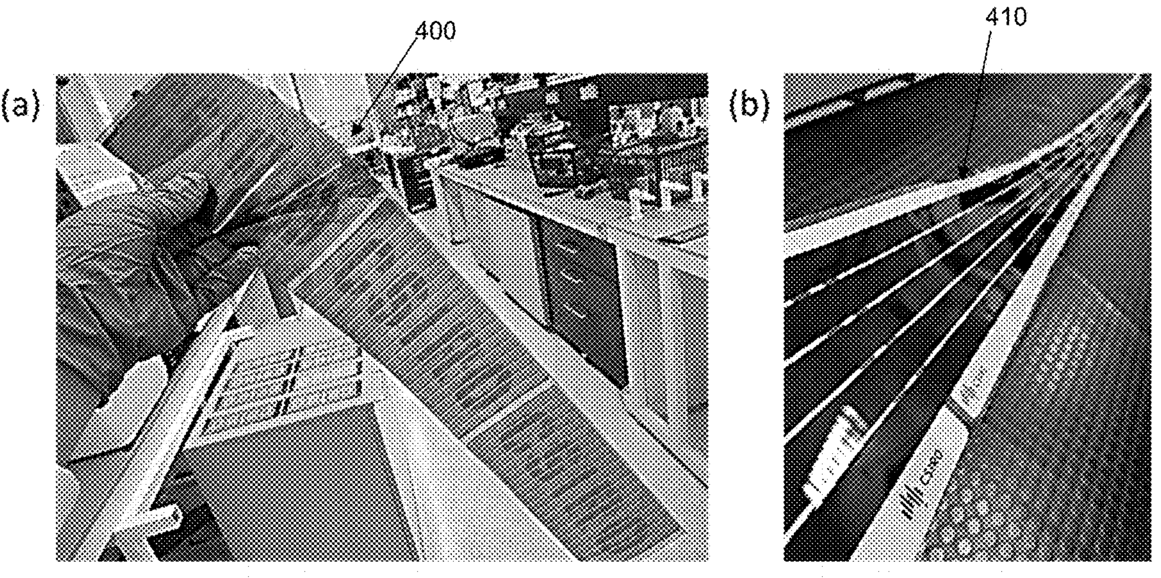
FIG. 5 provides further examples of designs of PV modules that can be produced using the process of the present invention including: (a) the perpendicular-module and (b) a conventional parallel-module (c) un-conventional module design fabricated by using laser scribing (Belectric, Germany).
Figure 5:
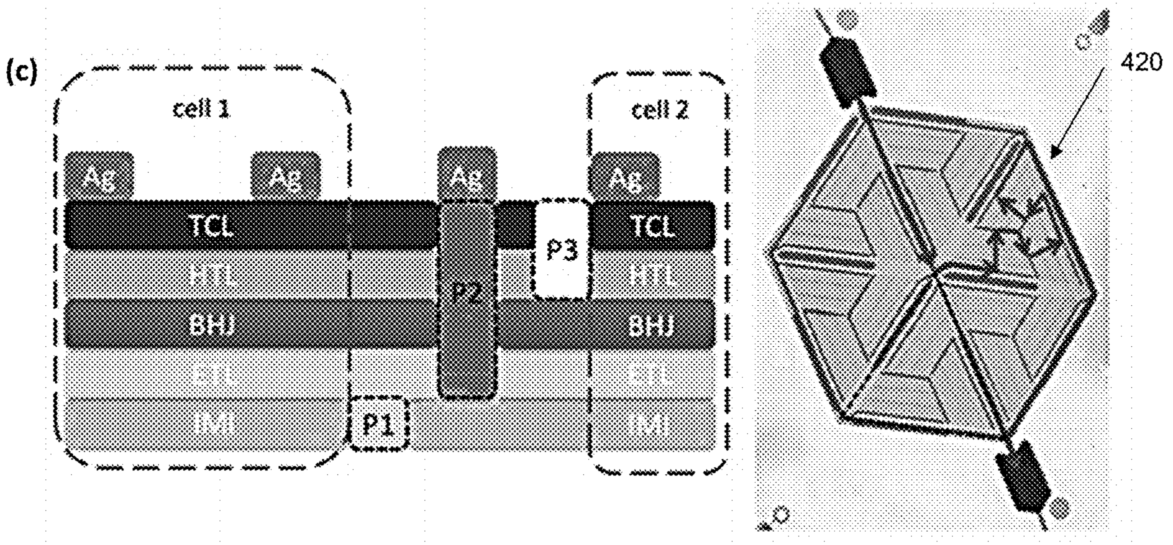

Process and device configuration of the present invention not only provides higher performance at low cost but also offers design freedom. An example of one device 400 comprising a module having a perpendicular cell design set up is shown in FIG. 5(*a*). These devices 400 can have much more plain looking from the front (substrate side). However, depending on thickness or material, the device 400 can be completely opaque without any pattern or semi-transparent as shown in FIG. 4. However, as will be explained in more detail below, images such as the CSIRO logo (as shown in FIG. 5(*a*)) can be added in the module. A conventional module 410 is shown in FIG. 5(*b*) for comparison. Although the longitudinally aligned stripe pattern (with respect to the longitudinal axis of the film) can be aesthetic in certain design/application, this longitudinal stripe pattern can limit the commercial application of printed PV.

A non-conventional module design 420 reported by Belectric OPV GmbH (currently OPVIUS) is also shown in FIG. 5(*c*). The module design 420 was fabricated by Belectric OPV GmbH using laser scribing to make the physical gap. It should be appreciated that this module design could also be fabricated using embodiments of the process of the present invention.

Printed Indicia

The first patterned coating of the transparent electrode layer 210 and the second patterned coating of the charge selective layer 220 can have any suitable configuration. In FIGS. 3, 4(*c*), 5(*a*) and 6(*a*), 6(*b*), 6(*c*) the first patterned coating comprises a plurality of spaced apart discrete rectangular first electrode sections 210A, 210B arranged in a regular pattern on the thin-film substrate 230. Each electrode section 210A, 210B has the same shape. The second patterned coating comprises a complimentary rectangular grid pattern to the first patterned coating.

Figure 6A:
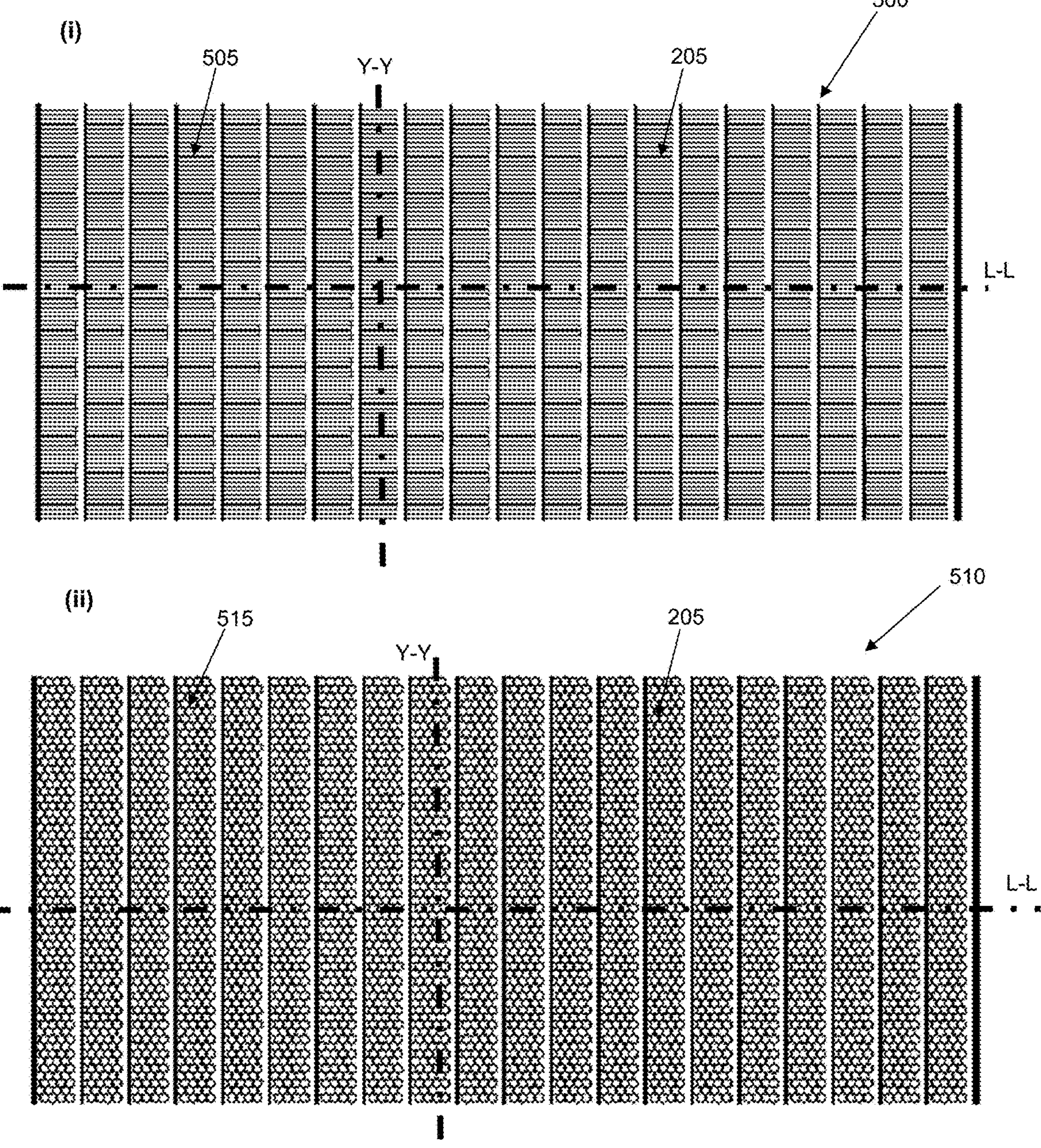
FIG. 6 illustrates various back electrode patterns for the device of the present invention showing: (a)(i) an example of mask design used for printing electrodes with homogenous lines; (a)(ii) a mask design used for printing electrodes with a grid pattern; (b) and (c) printing electrodes with a grid pattern incorporating variations in line thickness to provide a visual pattern.
Figures 6B, 6C:
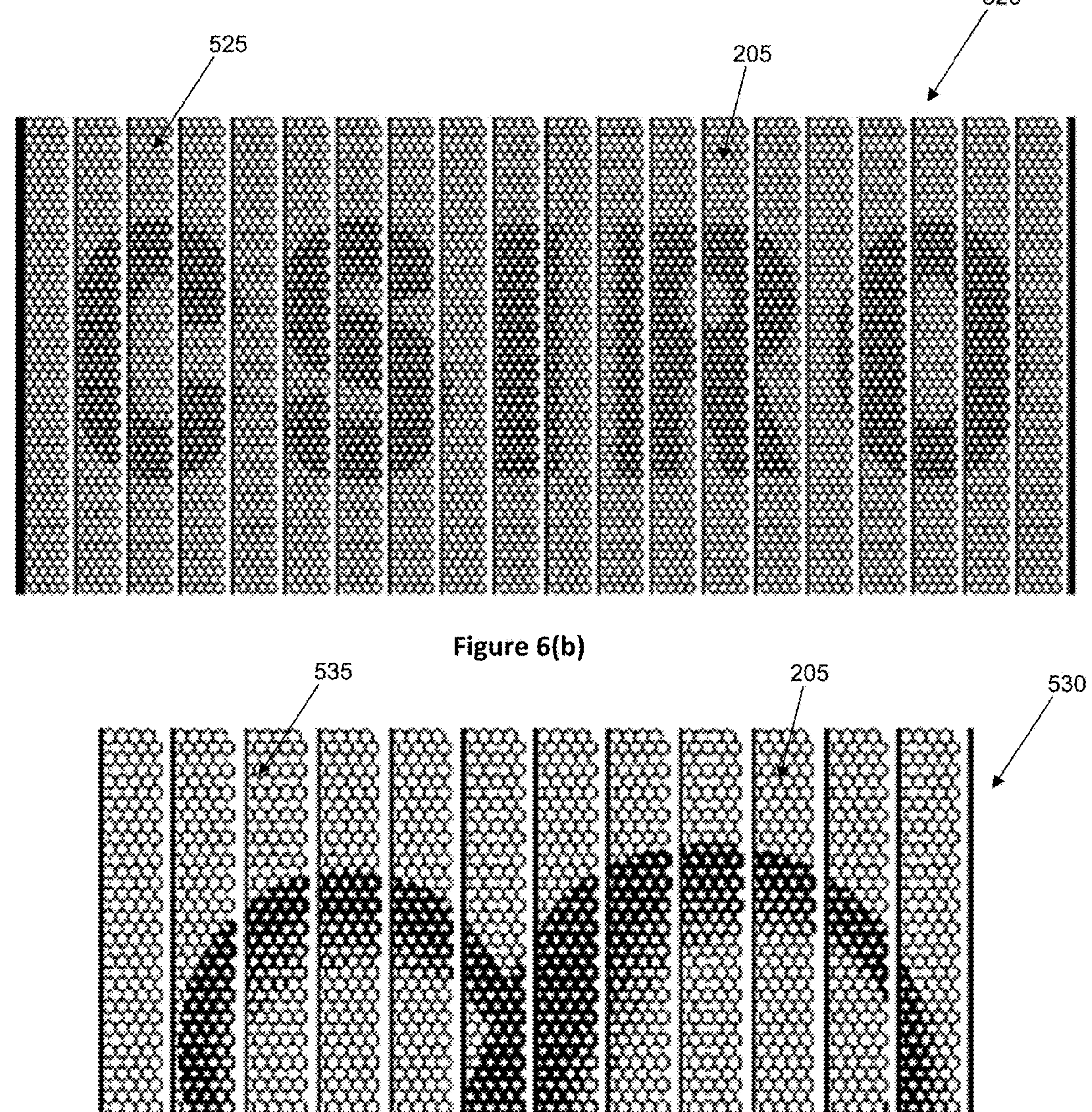
Figure 7:
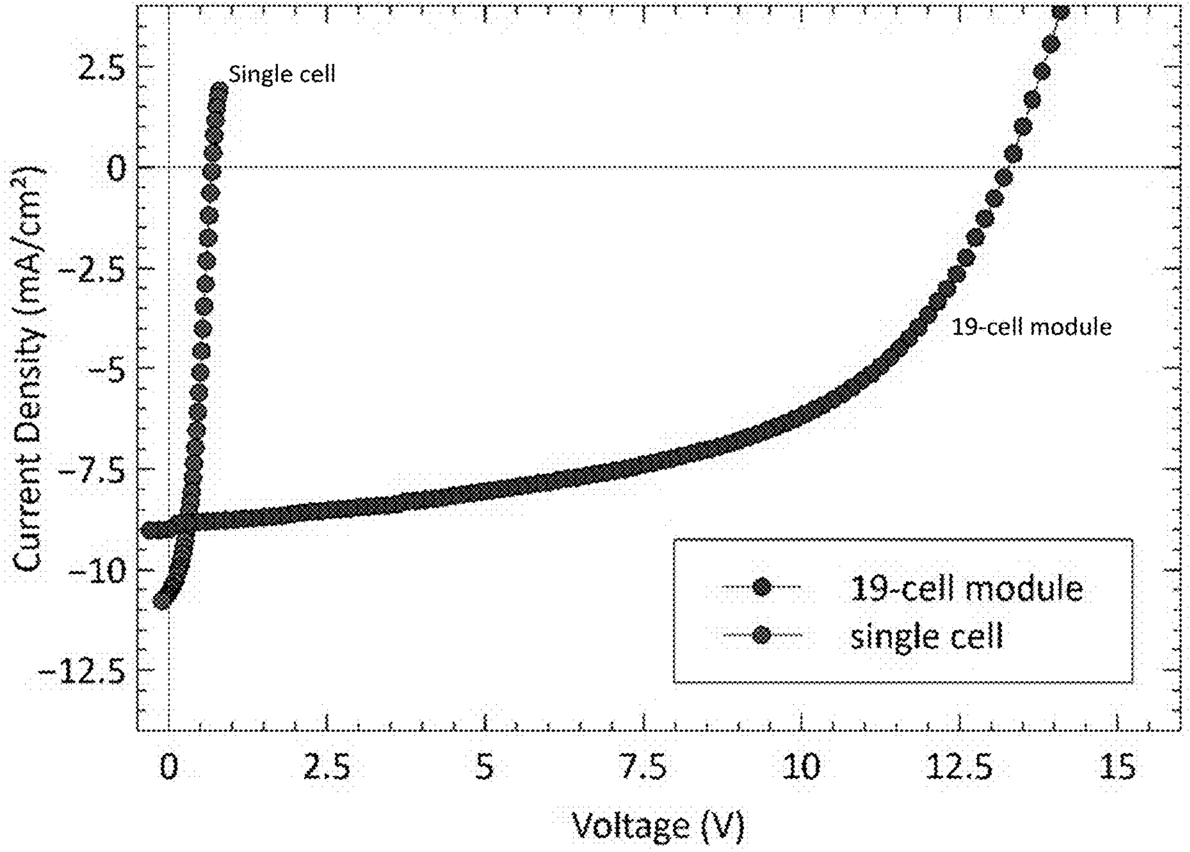
FIG. 7 provides an example current density (per cell area rather than the whole module area for comparison)-voltage characteristics of a single PV cell and a perpendicular-module with 19 cells in series connection having device configuration: flexible ITO (transparent electrode)/PEIE (electron selective layer)/PI-4 (commercial photoactive ink)/S315 (hole selective layer—commercial PEDOT:PSS ink)/PV-416 (back electrode—commercial silver paste).

In the embodiments shown in FIGS. 6(*a*), 6(*b*) and 6(*c*) the first patterned coating and second patterned coating comprise a plurality of spaced apart rectangular sections having a first longitudinal axis Y-Y applied to the substrate 230 so that the length of the rectangular section run widthwise on the substrate 230 and such that the rectangular sections are spaced apart and aligned lengthways along the second longitudinal axis L-L, which follows the length of the substrate 230.

The back electrode 205 can be designed by screen printing narrow solid lines of the back electrode composition onto the dried charge selective layer 220, for example as shown in FIGS. 4(*c*) and 6(*a*)(*i*). Greater detail of the possible print patterns is illustrated in FIG. 6(*a*). In each of these embodiments, the back electrode 205 is printed to include gap portions, for example as a grid or spaced apart lines. As shown in FIG. 6(*a*)(*i*), the lines of the back electrode 205 in each cell 505 can be arranged as a set of homogenous lines. However, greater design freedom can be achieved by using different line thicknesses and therefore varying the overall device transparency. Moreover, more design freedom in the pattern can be achieved by printing the back electrode 205 coating (the third patterned coating) as a grid 515, 525, 535 formed from a regular repeating geometric shape, such as a hexagon as shown in the devices 510, 520, 530 in FIGS. 6(*a*)(*ii*), 6(*b*) and 6(*c*).

A highlighted pattern can then be rendered in this grid 525, 535, such the CSIRO brand (FIGS. 5(*a*) and 6(*b*)) by highlighting sections of that grid 525, 535 by using thicker/wider lines in portions of the grid 525, 535 compared to other portions of the grid 525, 535. Those highlighted parts can be designed to form patterns within the grid 525, 535, which when the grids 525, 535 are designed to have a contrasting shade and/or colour to the underlying layers, can produce a visual and/or visible pattern disenable to a viewer of the integrated multilayer thin-film electronic device. That visual and/or visible pattern can comprise a pattern, picture, indicia such as logos, letters, numbers, symbols, patterns, rendered images, one or more words, signs, marks, emblems, tag, seal, stamp or the like. In certain embodiments, the thickness/width of the selected portions of elements in the grid 525, 535 are at least 1.5 time, preferably 2 times the thickness of adjoining elements in the grid 525, 535. However, it should be appreciated that any suitable thickness/width difference may be used that provides a discernible rendering of the selected indicia.

As shown in FIG. 6(*b*), a logo such as CSIRO logo can be rendered by varying the thickness of the lines in the grid 525 to produce a darker pattern that renders the letters making up CSIRO. As shown in FIG. 6(*c*), gradient images can also be achieved by varying the thickness/width of the lines in the grid 535 to produce different shades.

In order to assist in rendering the selected indicia in the grid 525, 535, the colour of the second electrode layer is preferably selected to contrast with the first functional layer and second functional layer. That colour is preferably selected to produce high-contrast lines relative to the colour of the first functional layer and second functional layer.

It should be appreciated that the images and indicia could be produced on any regular repeating grid of lined third patterned coating, for example using the more conventional stripe design shown in FIG. 6(*a*)(*i*). However, it is possible that these patterns may introduce high-contrast lines that can detract from the image or indicia trying to be rendered.

EXAMPLES

Example 1—Organic Photovoltaic Modules

Roll to Roll (R2R) processed organic photovoltaic (OPV) modules comprising multiple series-connected strip cells in an 'inverted' configuration were fabricated on an ITO-coated PET film (8 Ω/sq, OPV8, Solutia) to give a device consisting of PET|ITO|PEIE|Pi-4|PEDOT:PSS|Ag. An indium tin oxide-polyethylene terephthalate (ITO-PET) substrate with a perpendicular-module design 10 mm wide ITO pattern with 1 mm wide gaps were used. The device configuration was therefore: flexible ITO/PEIE (electron selective layer)/PI-4 (commercial photoactive ink)/S315 (commercial PEDOT:PSS ink, hole selective layer)/PV-416 (commercial silver paste).

The module was coated as follows:

An aqueous solution of PEIE (Mw 70,000 g/mol, 35-40% w/w, Aldrich) was diluted with 2-methoxy ethanol to a concentration of 0.15% w/w. This solution was coated onto ITO-coated PET film by the reverse-gravure coating method using a Mina-Labo™ coater (Yasui Seiki Co. Ltd) to form a PEIE film having an estimated thickness of around 10 nm. Both the PEIE and active polymer light-absorbing layers were deposited on the reverse-gravure (RG) coater were coated on ITO-PET substrates using a 200 R roll with a coating width of 10 cm. The coating was carried out at 1.0 m/min speed and 4 rpm of RG roll speed. The PEIE layer was dried by hot air at 110° C. for ~7 s and annealed on a curved hot plate at 140° C. for ~7 s.

The Pi-4 (InfinityPV ready-made active ink) polymer absorber layer (~100 nm thick) was coated at 1.0 m/min web speed and 5.5 rpm of roll speed. During the active layer deposition, the film was dried only using hot air at 90° C. for ~7 s and on a curved hot plate at 90° C. for ~7 s.

Roll to roll (R2R) Deposition of PEDOT:PSS strips and the Ag grid were carried out using the screen-printing method on an Orthotec-2 R2R screen printing system with a drying step using hot air at 100° C. and IR radiation (30% intensity) for ~20 s. PEDOT:PSS was screen printed twice to form a pinhole-free layer using a screen-printable paste continuing S315 (Agfa) and ORGACON Screen-print Ink (Agfa) PEDOT:PSS materials with the ratio of 1:9 mixed for over 10 minutes using high shear mixer (ULTRA-TURRAX T25, IKA Labortechnik).

To enhance charge collection of the module and to establish the interconnection between the 20 cells in series, a screen-printed grid was deposited using a commercially available Ag ink (DuPont, PV416, 2021). The Ag ink has co-solvents consisting of two alkyl esters: pentanedioic acid dimethyl ester (Dimethyl glutarate) and butanedioic acid dimethyl ester (Dimethyl succinate). Based on GC-MS analysis, dimethyl glutarate is the major solvent in the Ag ink. Each deposited layer had 0.2 to 0.5 mm offset from the under-laying layer so that series-connection could be made. The screen-printed Ag grid was dried using hot-air at 100° C. and IR radiation (30% intensity) for ~20 s. The active area of each strip cell is 8.1 $cm^2$ (width: 0.9 cm and length: 9 cm) resulting in total active module area of ~162 $cm^2$.

The device characteristics of the module are shown in FIG. 6. FIG. 6. Example current density (per cell area rather than the whole module area for comparison)-voltage characteristics of a single PV cell and a perpendicular-module with 19 cells in series connection.

Only commercial solutions are used in the demonstration example without modifications. However, it should be appreciated that the solutions, such as the conductive inks can be modified for the increased channel-forming property by adding good solvents for the photo-active layer.

Whilst the above disclosure and example relates to opto-electrical devices, specifically photovoltaic devices, it should be appreciated that the present invention can be applied to many other solution-processed integrated multi-layer thin-film electronic devices such as organic transistors, OLEDs, organic memories and printed sensors. In these devices, the differential orthogonal solubility of alternating material layers and selected patterning of layers taught in relation to the process of the present invention can be utilised in a similar manner to form an electrical interconnection between two spaced apart electrode layers within the multilayer structure thereof.

Those skilled in the art will appreciate that the invention described herein is susceptible to variations and modifications other than those specifically described. It is understood that the invention includes all such variations and modifications which fall within the spirit and scope of the present invention.

Where the terms “comprise”, “comprises”, “comprised” or “comprising” are used in this specification (including the claims) they are to be interpreted as specifying the presence of the stated features, integers, steps or components, but not precluding the presence of one or more other feature, integer, step, component or group thereof.

The invention claimed is:

1. A process of forming an electrode interconnection between at least two adjacent unit devices in an integrated multilayer thin-film electronic device comprising:

providing an intermediary device that comprises:

a first electrode layer on a thin film substrate comprising a first patterned coating that includes at least two spaced apart first electrode sections of adjacent unit devices;

a first functional layer comprising a substantially continuous coating over the first electrode layer; and a second functional layer comprising a second patterned coating on the first functional layer comprising at least two spaced apart functional sections, each functional section positioned on the first functional layer to overlay a portion of one of the first electrode sections so to define a gap portion between adjacent functional sections that includes a portion of that first electrode section and the first functional layer; and applying a second electrode layer over the second functional layer as a third patterned coating that includes at least two spaced apart second electrode sections of adjacent unit devices, each second electrode section being positioned to overlay at least one functional section of the second functional layer and a portion of an adjoining gap portion that includes at least one portion of the first electrode section of an adjacent unit device, the third patterned coating being formed using a solution including a conductive species and at least a first solvent, wherein the first functional layer is soluble in the first solvent and the second functional layer has a low to zero solubility in the first solvent, such that application of the second electrode layer to the gap portion forms at least one electrically conductive path through the first functional layer between the first electrode and the second electrode of adjacent unit devices.

2. The process according to claim 1, wherein the second functional layer has a substantially low to zero solubility in the first solvent.

3. The process according to claim 1, wherein the first functional layer comprises a polar layer and the second functional layer comprise a non-polar layer; or the first functional layer comprises a non-polar layer and the second functional layer comprises a polar layer and wherein the first solvent has the same polarity as the first functional layer.

4. The process according to claim 1, wherein the first solvent comprises:

DMF, DMSO, Y-butyrolactone, acetone, acetyl acetone, ethyl acetoacetate, NMP, DMAC, THE or combinations thereof;

isopropanol, n-butanol, isobutanol, ethanol, methanol, acetic acid, ethylene glycol, propylene glycol, glycerol, allyl alcohol, propagyl alcohol, inositol or combinations thereof; or benzene, toluene, xylenes, trimethylbenzene, chlorobenzene, dichlorobenzene, chloroform, dichloromethane, anisole, propylene glycol methyl ether acetate, diethylene glycol mono butyl ether, di (propylene glycol) dimethyl ether or combinations thereof.

5. The process according to claim 1, wherein the at least one electrically conductive path between the first electrode and the second electrode of adjacent unit devices comprises one or more micro- to nano-sized channels through the first functional layer, and wherein the at least one electrically conductive path between the first electrode layer and second electrode layer preferably comprises one or more defects in the first functional layer.

6. The process according to claim 1, wherein the intermediary device includes at least one of:

at least one further functional layer between the first and second functional layers; or at least one further functional layer between the first electrode layer and the first functional layer.

7. The process according to claim 1, wherein the intermediary device includes at least one further functional layer between the substrate and the first functional layer.

8. The process according to claim 1, further comprising forming the intermediary device by:

applying the first electrode layer on a thin film substrate comprising the first patterned coating that includes at least two spaced apart first electrode sections of adjacent unit devices;

applying the first functional layer comprising a substantially continuous coating over the first electrode layer; and applying the second functional layer comprising the second patterned coating on the first functional layer comprising at least two spaced apart functional sections, each functional section positioned on the first functional layer to overlay a portion of one of the first electrode sections so to define a gap portion between adjacent functional sections that includes a portion of that first electrode section and the first functional layer.

9. The process according to claim 1, wherein the first patterned coating comprises a plurality of spaced apart discrete first electrode sections, each electrode section comprising a geometric shape arranged in a regular pattern on the thin-film substrate.

10. The process according to claim 1, wherein the second patterned coating comprises a complimentary pattern to the first patterned coating.

11. The process according to claim 1, wherein the gap portions between adjacent functional sections comprise the first electrode layer and first functional layer only.

12. The process according to claim 1, wherein the first patterned coating and second patterned coating comprise a plurality of spaced apart rectangular sections having a first longitudinal axis applied to a flexible strip having a second longitudinal axis aligned along the strip length, the rectangular sections being arranged on the flexible strip with the first longitudinal axis perpendicularly aligned to the second longitudinal axis.

13. The process according to claim 1, wherein the third patterned coating comprises:

a complimentary pattern to the second patterned coating; or a grid formed from a regular repeating geometric shape, the grid being formed from a series of spaced apart elements.

14. The process according to claim 13, wherein the colour of the second electrode layer is selected to contrast with the first functional layer and second functional layer to produce high-contrast lines relative to the colour of the first functional layer and second functional layer.

15. The process according to claim 1, wherein the thin-film substrate comprises a flexible substrate, or comprises at least one of a polymer, metal, ceramic or glass.

16. The process according to claim 1, wherein the first functional layer comprises a photoactive layer, and the photoactive layer comprises at least one of one or more organic photovoltaic compounds, or one or more perovskite photo-active compounds.

17. The process according to claim 16, wherein the second functional layer comprises a charge selective layer, the second electrode layer comprises a metallic electrode, and at least the first solvent, and the first electrode layer comprises a transparent electrode layer.

18. The process according to claim 17, wherein the substrate includes one or more layers or coatings selected from at least one of:

at least one coating of a transparent conductor layer;

at least one hole transporting layer comprising an organic or inorganic semiconductor; or at least one electron transporting layer comprising an organic or inorganic conductor.

19. An integrated multilayer thin-film electronic device comprising:

a first electrode layer on a thin film substrate comprising a first patterned coating that includes at least two spaced apart first electrode sections of adjacent unit devices;

a first functional layer comprising a substantially continuous coating over the first electrode layer; and a second functional layer comprising a second patterned coating on the first functional layer comprising at least two spaced apart functional sections, each functional section positioned on the first functional layer to overlay a portion of one of the first electrode sections so to define a gap portion between adjacent functional sections that includes a portion of that first electrode section and the first functional layer; and a second electrode layer on the second functional layer comprising a third patterned coating that includes at least two spaced apart second electrode sections of adjacent unit devices, each second electrode section being positioned to overlay at least one functional section of the second functional layer and a portion of an adjoining gap portion that includes at least one portion of the first electrode section of an adjacent unit device, wherein each gap portion includes at least one electrically conductive path through the first functional layer between the first electrode and the second electrode of adjacent unit devices, and wherein the at least one electrically conductive path between the first electrode and the second electrode of adjacent unit devices comprises one or more channels comprising one or more defects in the first functional layer.

20. The device according to claim 19, wherein the at least one electrically conductive path between the first electrode and the second electrode comprises one or more micro- to nano-sized channels through the first functional layer, and wherein substantially all or all of the gap portion provides the conductive path between the first electrode and the second electrode.

* * * * *